United States Patent [19]

Chen et al.

[11] Patent Number: 4,698,672
[45] Date of Patent: Oct. 6, 1987

[54] CODING SYSTEM FOR REDUCING REDUNDANCY

[75] Inventors: Wen-hsiung Chen, Sunnyvale; Daniel J. Klenke, Milpitas, both of Calif.

[73] Assignee: Compression Labs, Inc., San Jose, Calif.

[21] Appl. No.: 923,630

[22] Filed: Oct. 27, 1986

[51] Int. Cl.$^4$ ................. H04N 7/133; H04N 7/137
[52] U.S. Cl. ................................. 358/136; 358/261; 358/262; 375/27
[58] Field of Search ............... 358/136, 135, 133, 261, 358/262; 375/27, 31, 33

[56] References Cited

U.S. PATENT DOCUMENTS

| | | | |
|---|---|---|---|
| 4,302,775 | 11/1981 | Widergren | 358/136 |
| 4,476,495 | 10/1984 | Fujisawa | 358/262 |
| 4,520,490 | 5/1985 | Wei | 375/27 |
| 4,558,370 | 12/1985 | Mitchell | 358/262 |
| 4,633,325 | 12/1986 | Usubuchi | 358/133 |

*Primary Examiner*—Howard W. Britton
*Attorney, Agent, or Firm*—Fliesler, Dubb, Meyer & Lovejoy

[57] ABSTRACT

The present invention relates to methods and apparatus for processing signals to remove redundant information thereby making the signals more suitable for transfer through a limited-bandwidth medium. The present invention specifically relates to methods and apparatus useful in video compression systems. Typically, the system determines differences between the current input signals and the previous input signals using mean-square difference signals. These mean-square signals are processed and compared with one or more thresholds for determining one of several modes of operation. After processing in some mode, the processed signals are in the form of digital numbers and these digital numbers are coded, using ordered redundancy coding, and transmitted to a receiver.

46 Claims, 4 Drawing Figures

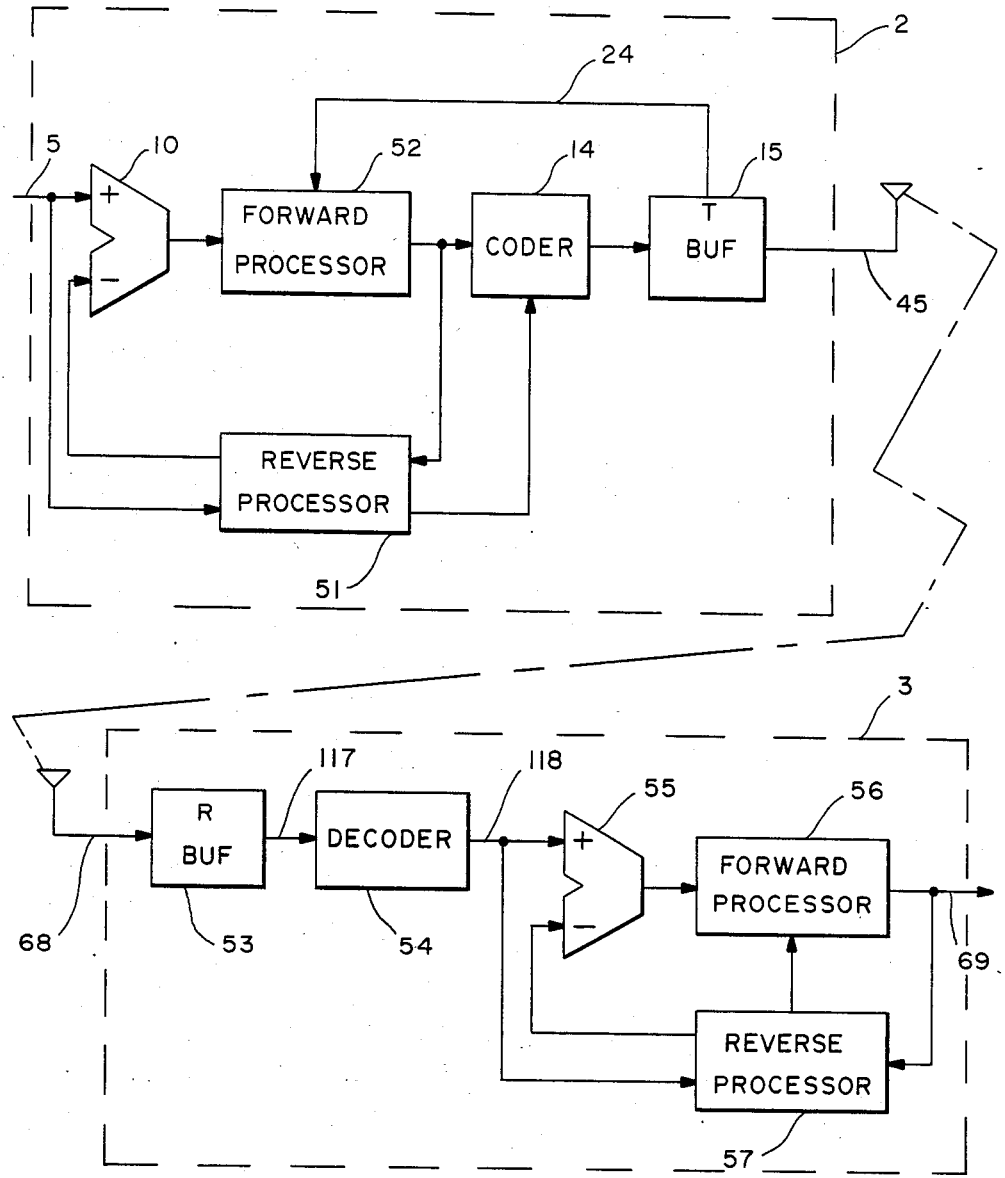
FIG.—1

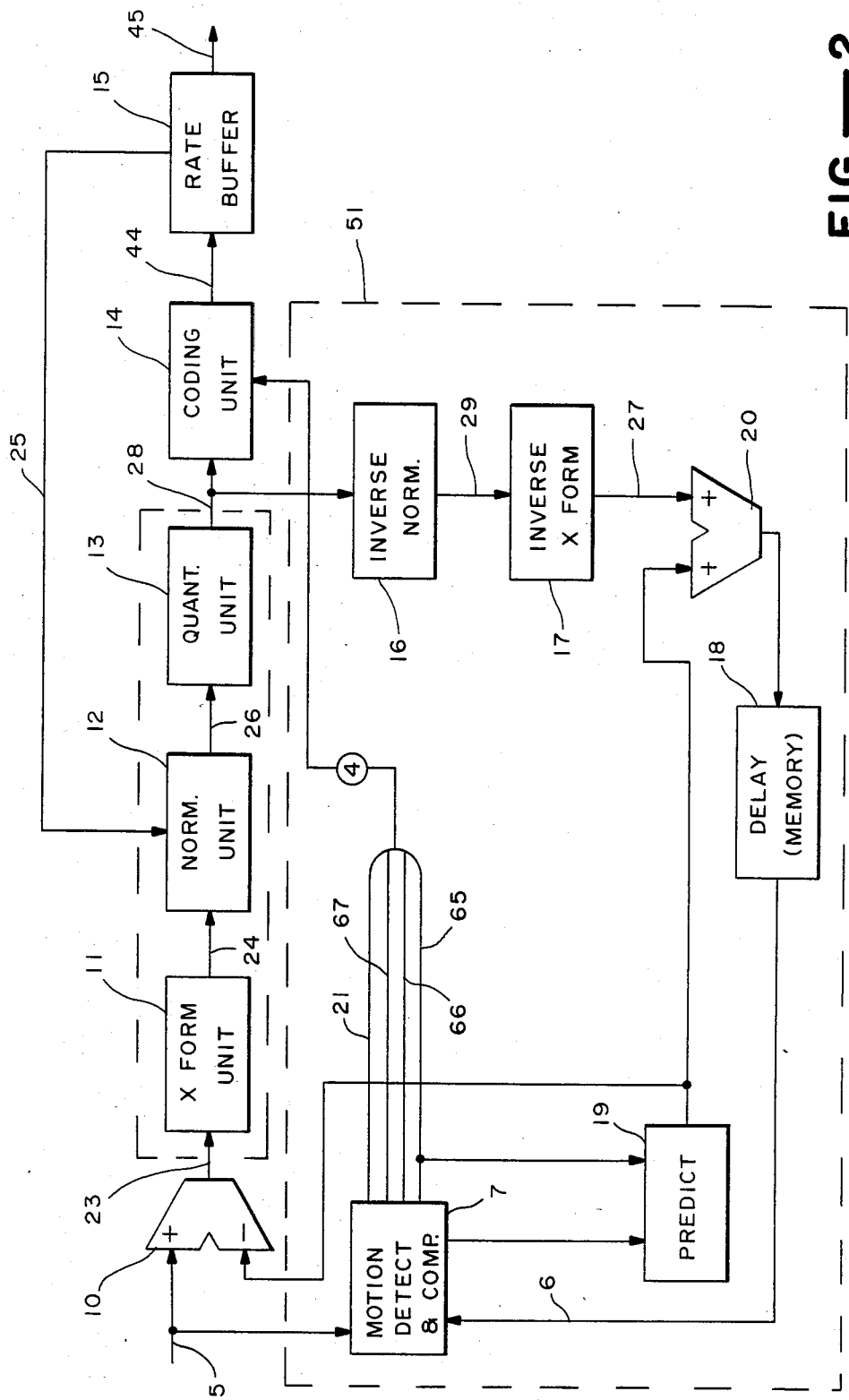
FIG.—2

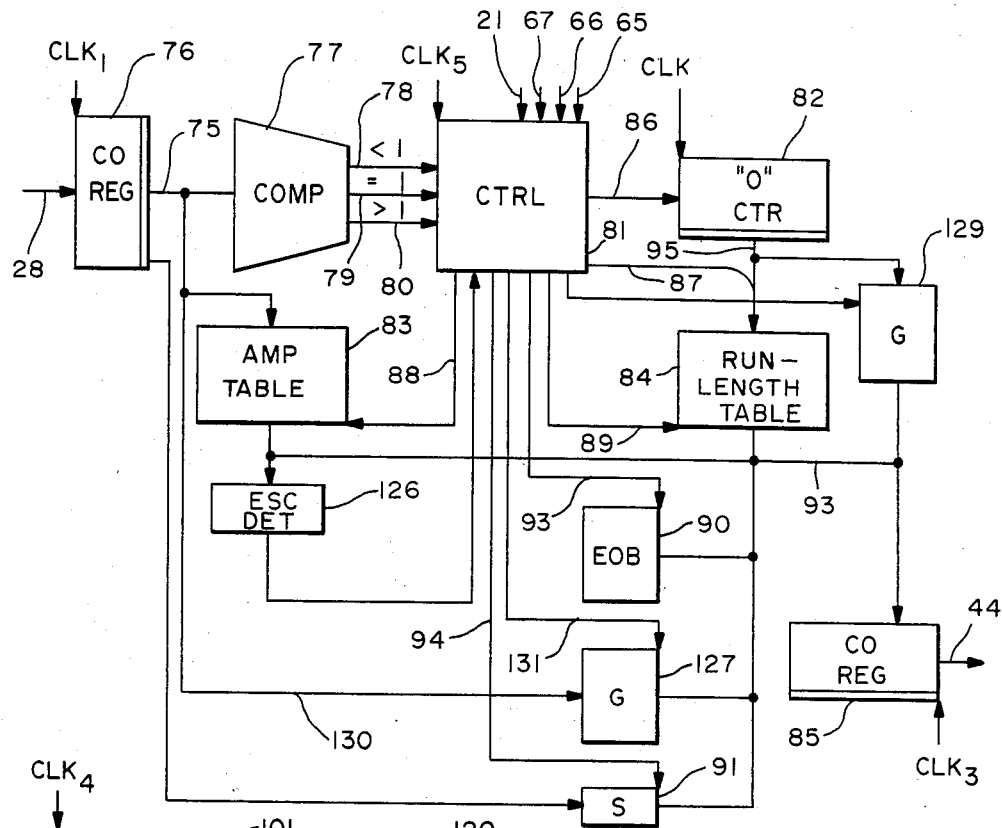
FIG.—3
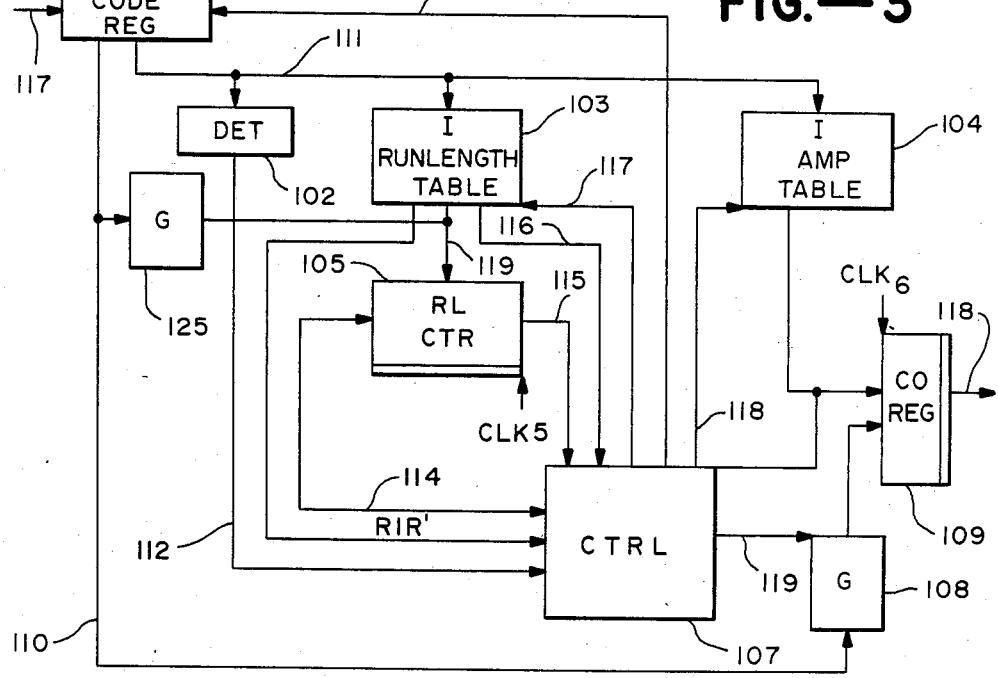
FIG.—4

CODING SYSTEM FOR REDUCING REDUNDANCY

CROSS-REFERENCE TO RELATED APPLICATION

Title: A COMBINED INTRAFRAME AND INTERFRAME TRANSFORM CODING SYSTEM
Ser. No.: 479,766 Filed: 83/03/28 (now abandoned)
Inventors: Wen-hsiung Chen, James Parker Elliott, Robert Edwin George Newell, Ralph Emerson Nichols, Albert Edwards Rackett

BACKGROUND OF THE INVENTION

The present invention relates to methods and apparatus for processing signals to remove redundant information thereby making the signals more suitable for transfer through a limited-bandwidth medium. The present invention specifically relates to methods and apparatus useful in video compression systems.

Many signal processing techniques useful in video compression systems are known. For example, digital encoding is often employed in processing television signals which are to be transferred over transmission channels since digital data streams are more immune to noise degradation.

In order to digitally encode a television signal, a signficant number of bits, 4 or more, may be required to provide for an acceptable range of gray scale for each of the hundreds of thousands of separate picture elements (pixels) which form an image. Consequently, data rates for unprocessed digitalized television signals typically require a bandwidth greater than 40 megabits per second. If the communications link is an earth satellite, an unprocessed video signal typically occupies nearly the entire bandwidth of the satellite, with very few channels, if any, left over for other uses. A T1 communication channel is typical and has only a 1.5 megabit per second bandwidth. A practical yet effective way to reduce the bandwidth of digitalized television signals is needed so that fewer channels are required for transmission over a communications path and so that the quality of transmitted signals is maintained even when reduced bandwidth transmission is employed.

U.S. Pat. No. 4,302,775, assigned to the same assignee as the present invention, describes a scene adaptive coding technique which eliminates redundant information and thereby reduces the bandwidth.

The patent describes a single-pass digital video compression system which implements a two-dimensional cosine transform with intraframe block-to-block comparisons of transform coefficients without need for preliminary statistical matching or preprocessing.

Each frame of the video image is divided into a predetermined matrix of spatial subframes or blocks. The system performs a spatial domain to transform domain transformation of the picture elements of each block to provide transform coefficients for each block. The system adaptively normalizes the transform coefficients so that the system generates data at a rate determined adaptively as a function of the fullness of a transmitter buffer. The transform coefficient data thus produced is encoded in accordance with amplitude Huffman codes and zero-coefficient runlength Huffman codes which are stored asynchronously in the transmitter buffer. The encoded data is output from the buffer at a synchronous rate for transmission through a limited-bandwidth medium. The system determines the buffer fullness and adaptively controls the rate at which data is generated so that the buffer is never completely emptied and never completely filled.

In the system receiver, the transmitted data is stored in a receiver buffer at the synchronous data rate of the limited-bandwidth medium. The data is then output from the receiver buffer asynchronously and is decoded in accordance with an inverse of the encoding in the transmitter. The decoded data is inversely normalized and inversely transformed to provide a representation of the original video image.

The U.S. Pat. No. 4,302,775 patents reduces redundancy by employing intraframe coding techniques utilizing intraframe comparisons of cosine transform coefficients. While the patent provides significant improvement over other techniques, there is a need for even greater compression.

In addition to intraframe coding techniques, interframe coding techniques have been used to reduce the rate required for video transmission as described, for example, in the above-identified application. Typically, each video frame is held in memory at both the transmitter and the receiver and only frame-to-frame changes are transmitted over the communication link. In contrast to intraframe coding schemes in which the quality of coded images is dependent upon the amount of detail in each single image frame, the quality of the coded image in interframe coding is dependent upon the differences from frame to frame. Frame-to-frame differences are often referred to as "motion".

Interframe coding techniques are broadly classified into two categories, namely, spatial domain coding and transform domain coding. In real-time interframe spatial-domain coding systems, spatial domain data can be threshold processed to obtain and store frame difference signals in a transmitter buffer. The threshold value can be adaptively determined as a function of the transmitter buffer fullness. In order to eliminate the image breakdown, both spatial and temporal subsampling has been proposed.

The above-identified U.S. patent application entitled "A Combined Intraframe and Interframe Transform Coding System" employs intraframe and interframe variable prediction transform coding. Images are represented by sequential frames of two-dimensional arrays of digital signals. The digital signals are transformed to form transform coefficients for each frame. Predicted transform coefficients are formed using sets of variable prediction factors. The predicted transform coefficients for each frame are compared with corresponding actual transform coefficients for the frame to form transform coefficient difference signals. The difference signals are processed to control their range of values. The processed difference signals are statistically coded such that the more frequently occurring values are represented by shorter code lengths and the less frequently occurring values are represented by longer code lengths. The coded signals are stored in a buffer memory for transmission. The coded signals in the buffer memory are transmitted, over a limited-bandwidth medium, to the receiver along with processing information. The processing information includes codes identifying the set of variable prediction factors utilized in the transmitter. The same set of variable prediction factors is utilized in the receiver to reconstruct predicted transform coefficients which in turn are used to reconstruct representations of the original images in the transmitter.

The extension of the Scene Adaptive Coding of U.S. Pat. No. 4,302,775 from intraframe coding to interframe coding has proven very significant in terms of improving image quality and reducing bandwidth. These improvements, however, have created a need for improved coding systems for reducing redundancy and there continues to be a need for improved signal processing methods and apparatus for data compression systems.

SUMMARY OF THE INVENTION

The present invention is a signal processor and method for efficiently processing signals using ordered redundancy (OR) coding and any one of a number of different modes.

The signals to be coded are typically multiple values where the multivalued digital numbers, X(k) are typically the integers 0, 1, 2, 3, 4, ..., and so on arranged in any order. Frequently, some values are repeated in forming digital numbers and hence the probable frequency of occurrence of some values is different than for other values. In one example of digital numbers, the highest frequency of occurrence is the value 0, the next highest frequency of occurrence is the value 1 and the other values greater than 1 (namely 2, 3, 4, 5, and so on) occur least frequently. With such order to the frequency of occurrence of values to be coded, the ordered redundancy coding of the present invention is most efficient.

Using ordered redundancy coding, the system codes the highest most frequently occurring values (0's in the usual example) using runlength coding. In the most preferable example, the runlength encoding is of two types, R and R'. The first type, R, is utilized when a runlength of consecutive zeros (0's) is followed by the next most frequently occurring value (1 in the usual case) and the other type, R', is utilized when the runlength of consecutive zeros (0's) is followed by some other value, one of the least frequently occurring values (usually greater than 1 such as 2, 3, and so on). Whenever the second type, R', of runlength coding is employed, the runlength code is typically followed by an amplitude code which explicitly encodes the actual amplitude (2, 3, . . . ) of the following other value. Whenever the first type, R, of runlength coding is employed, no coding of the second value (usually 1) is required because an amplitude of 1 is implied simply by the use of the first type, R, of runlength coding.

The ordered redundancy coding of the present invention is typically utilized in a system that processes input signals, such as spatial domain image signals occurring in successive frames, to form processed signals for each frame. Any number of different processing modes are possible. The processed signals are in the form of a plurality of multivalued digital numbers, X(k), typically one number, X(k), for each frame.

In one particular embodiment, the processing modes include two replenishment modes (one with motion compensation and one without), two DPCM modes (one with motion compensation and one without) and one intraframe mode. The decision as to which mode to select is made based upon an analysis of the frame-to-frame differences (motion) between the current input signals and the previous input signals.

Typically, the system determines differences between the current input signals and the previous input signals using mean-square difference signals. These mean-square signals are processed and compared with one or more thresholds for determining one of several modes of operation. After processing in some mode, the processed signals are in the form of digital numbers and these digital numbers are coded, using ordered redundancy coding, and transmitted to a receiver.

After transmission of the coded signals, the received signals are decoded and processed in reverse of the particular one of the modes by which the signals were processed in the transmitter.

In accordance with the above summary, the present invention achieves the objective of providing an improved signal processor for reducing redundancy using ordered redundancy coding.

The foregoing and other objects, features and advantages of the invention will be apparent from the following detailed description in conjunction with the drawings.

BRIEF DESCRIPTION OF THE DRAWINGS

FIG. 1 depicts a block diagram of a transmitter and receiver system.

FIG. 2 depicts further details of the transmitter of the FIG. 1 system.

FIG. 3 depicts further details of the coder used in the FIG. 2 transmitter.

FIG. 4 depicts further details of the decoder used in the receiver.

DETAILED DESCRIPTION

Overall System—FIG. 1

In FIG. 1, a block diagram of a transmitter and a receiver in accordance with the present invention is shown. Digital signals to be processed are input on lines 5 to the transmitter 2. The input signals on lines 5 are processed in one of a number of different modes so as to efficiently compress the data input signals to form processed signals for transmission to a receiver. The processed signals are coded and output on lines 45 from the transmitter 2 and are transmitted to the receiver 3.

The transmitter 2 includes a forward processor 52 and a feedback (reverse) processor 51. Typically, the input signals on lines 5 represent images and are presented in the space domain as frames in accordance with well known techniques. The forward processor 52 typically processes the spatial domain input signals to form processed signals which typically are transform domain signals arranged in blocks of transform domain coefficients. The forward processor 52 processes the current input signals from the most current frame.

The reverse processor 51 typically inverse processes signals from transform domain to spatial domain. Processor 51 stores signals representing the previous frame of data and also receives the current input signals so as to enable a comparison to be made between the previous inverse processed input signals and the current input signals. When the current input signals have been transformed from the spatial domain to the transform domain, the reverse processor performs an inverse transform to convert the transform domain signals back to spatial domain signals and stores those spatial domain signals for comparison with the current input spatial domain signals.

The reverse processor 51 determines changes between the current signals and the previous signals. Typically, these differences are determined using mean-square signals, $d_0$ and $d_b$, hereinafter defined. These mean-square signals are processed and compared with one or more thresholds for determining one of several modes of operation for the system of FIG. 1.

Any number of different modes are possible. In one particular embodiment, two replenishment modes (one with motion compensation and one without), two DPCM modes (one with motion compensation and one without) and one intraframe mode are employed. The decision as to which mode to select is made based upon an analysis of the frame-to-frame differences (motion) of the input data. After the processing by the processor 52 and the processor 51, the processed signals are input to the coder 14.

The coder 14 encodes the processed signals using statistical frequency coding. With satistical frequency coding, signals with a statistically higher frequency of occurrence are encoded with a shorter code length than signals with a statistically lower frequency of occurrence. Additionally, the coder 14 utilizes a novel ordered redundancy (OR) coding technique. In the ordered redundancy coding, the processed signals to be coded have multiple values. For example, values are typically 0, 1, 2, 3, 4, ..., and so on. Typically, the statistical frequencies of the values to be coded have an order. Particularly, that order is based upon the probable frequency of occurrence of the different values. The highest frequency of occurrence is typically the value 0, the next most frequently occurring value is 1 and the other values greater than 1 (2, 3, 4, 5, and so on) occur least frequently. With such order to the signals to be coded, the ordered redundancy coding of the present invention is most efficient.

Using OR coding, the coder 14 of FIG. 1 codes the highest most frequently occurring values (0's in the usual example) using runlength coding. In the most preferable example, the runlength encoding is of two types, R and R'. The first type, R, is utilized when the runlength of 0's is followed by the next most frequently occurring value (1 in the usual case) and the other type, R', is employed when the runlength of 0's is followed by some other value of the least frequently occurring type (usually greater than 1 such as 2, 3, and so on). Whenever the R' type of runlength coding is employed, the runlength code is typically followed by an amplitude code which explicitly encodes the actual amplitude of the other value. Whenever the first type, R, of runlength coding is employed, no coding of the second value (usually 1) is required because an amplitude of 1 is implied simply by the use of the first type, R, of runlength coding.

After the ordered redundancy coding in coder 14, data is transferred to the transmitter buffer 15. The buffer 15 provides a feedback signal on line 25 to control the forward processor 52 data rate.

In FIG. 1, the data from line 45 is input on line 68 after transmission over some conventional transmission medium to the receiver 3. In the receiver 3, a receiver buffer 53 stores the received data. A decoder 54 decodes the received data. Thereafter, the decoded data is processed in reverse of the particular one of the modes by which the data was processed in the transmitter 2. The reconstituted data appears on output line 69.

Transmitter—FIG. 2

FIG. 2 is a block diagram of a transmitter for motion compensated combined interframe and intraframe coding system of FIG. 1. Motion compensation is incorporated into a combined interframe and intraframe coding system using the spatial pixels in the inverse loop 9. In operation, the original spatial image on input lines 5 is compared to the reconstructed spatial image on lines 6 of the previous frame on a block-by-block basis through a motion detector 7. The reconstructed spatial image is obtained from the memory 18 of the feedback DPCM loop 9.

The feedback loop 9 includes the inverse normalizer 16, inverse transformer 17, the sum unit 20, the delay (memory) 18, the prediction unit 19, and the motion detector and compensator 7. If the motion detector 7 determines that there is little difference between the blocks, a "replenishment mode" is selected. On the other hand, if enough difference is detected, the block in the current frame is compared to the neighborhood of the corresponding reconstructed block in the previous frame to find the best match of the block. For the purpose of increasing the system performance a sub-pixel match is employed. If the difference between the current block and its best matched block does not result in a reasonable improvement over the difference between the current block and its original counterpart, a motion compensation is not justified. In this case, a "DPCM mode" with variable predictions is selected to handle the block difference. On the other hand, if the difference between the current block and its best matched block is reasonably smaller than the difference between the current block and its original counterpart, a motion compensation is initiated. In this case, the difference between the current block and its best matched block is screened to determine if the block belongs to a "motion compensated replenishment" block or a "motion compensated DPCM" block. The forward loop of the DPCM system encodes the "DPCM" or "motion compensated DPCM" data in the transform domain. Statistical frequency coding is employed to improve the efficiency. The feedback loop of the DPCM system is operated in the spatial domain with variable predictions.

Motion Detection and Compensation

The motion detection serves two purposes. It compares the block pixels in the present frame to the neighborhood pixels of the corresponding block in the previous frame to find the sub-pixel displacement of the block that gives the best match. It also tracks the displacement vectors and the degree of differences during the matching process for a subsequent modification of the DPCM frame memory and controlling of the predictor parameters in the feedback DPCM loop. Three basic types of modes (replenishment modes, intraframe mode, and DPCM modes) are determined from the motion detection. A decision process among the modes is employed. The decision process relies in part on a determination as to whether motion-compensation or non-motion-compensation is to be employed. Motion compensation is determined using the mean-square difference, $d_0$, and the mean square error, $d_b$.

The mean-square difference, $d_0$, is formed as follows:

$$d_0 = (1/N^2) \sum_{j=0}^{N-1} \sum_{k=0}^{N-1} [f(j,k) - \bar{f}(j,k)]^2 \qquad \text{Eq. (1)}$$

where $f(j,k)$ are spatial pixels (on lines 5 of FIG. 2) of the current frame and $\bar{f}(j,k)$ are the corresponding pixels (on line 6 of FIG. 2) of the reconstructed previous frame. N is the transform block size.

The mean-square error, $d_b$, is formed as follows:

$$d_b = (1/N^2) \sum_{j=0}^{N-1} \sum_{k=0}^{N-1} [f(j,k) - \bar{f}(j + \Delta j, k + \Delta k)]^2 \quad \text{Eq. (2)}$$

where f(j,k) are the block pixels in the present frame and f(j+$\Delta$j,k+$\Delta$k) are the best matched pixels in the previously reconstructed frame where $\Delta$j,$\Delta$k are the displacement (vector) for the best match.

Replenishment Modes

The replenishment modes are either motion-compensated or non-motion-compensated. The decision process selects compensation or non-compensation based upon motion detection. The motion detection unit 7 of FIG. 2 determines the difference between the incoming spatial pixels of a block and the reconstructed spatial pixels of the corresponding block in the previous frame. If the motion detection process determines that there is little frame-to-frame difference between corresponding blocks, a non-motion-compensated replenishment mode is selected and a code word is sent on line 21 from unit 7 of FIG. 2 to the encoder 14 to identify the mode.

If the motion detection process determines that the frame-to-frame block difference is great enough then, under some circumstances, a motion-compensated replenishment mode is selected. The detection process typically uses the mean-square difference, $d_0$, and compares it to a predetermined non-motion-compensated replenishment threshold, $T_R$. This process is written as follows:

if $(d_0-d_b) < T_M$ and $d_0 < T_R$, select non-motion-compensated replenishment mode.

The detection process compares the mean square error, $d_b$, with a predetermined motion-compensated replenishment threshold, $T_{D/R}$, as follows:

if $(d_0-d_b) > T_M$ and $d_b < T_{D/R}$, select motion-compensated replenishment mode.

The identification code words for the replenishment modes are typically Huffman coded. Typically, a one-bit code (0), on line 21 of FIG. 2 is used if the non-motion-compensated replenishment mode appears most frequently statistically. Once this code word is identified at the receiver, the reconstructed block pixels in the previous frame are repeated to form the present block in the receiver.

For the motion compensated replenishment block, typically a four-bit code (1111) is used, along with the displacement vector representing the best match, and appears on line 67 in FIG. 2. At the receiver, the vector uses the compensated block pixels from the reconstructed previous frame to form the presently reconstructed block.

DPCM Modes

The DPCM modes are either non-motion-compensated or motion-compensated. Selection of the compensation or non-compensation DPCM modes is dependant in part on motion detection. The motion detection searches for the best matched block pixels from the reconstructed previous frame. The difference, $d_b$, between the present block pixels and the best matched block pixels is then computed. If this difference is smaller than the motion threshold, $T_M$, no motion compensation is justified due to the necessity of sending the displacement vector as coding overhead. In this case, the difference, $d_0$, is compared to a DPCM threshold, $T_{D/I}$, to determine if the block belongs to a DPCM mode. The decision process is given as follows:

if $(d_0-d_b) < T_M$ and $d_0 < T_{D/I}$, select non-motion-compensated DPCM mode.

If a non-motion-compensated DPCM mode is selected, the predictor in the feedback loop is enabled and the difference is sent to the discrete cosine transformer for subsequent encoding. Again, the mode identification is Huffman coded. Typically, a two-bit code (10) used for the non-motion-compensated DPCM mode and appears on line 66 in FIG. 2.

At the receiver, the DPCM data are inversely transformed and added onto the block pixels from the reconstructed previous frame to form the present block pixels.

For the motion-compensated DPCM mode, the difference, $d_b$, between the current block pixels and the best matched block pixels is compared to a predetermined motion-compensated replenishment threshold, $T_{D/R}$. If $d_b$ is larger than the threshold, a motion-compensated DPCM mode is selected to handle the pixel differences.

The decision processs is given as follows:

If $(d_0-d_b) > T_M$ and $d_b > T_{D/R}$, select motion-compensated DPCM mode.

For the motion compensated DPCM blocks, typically a three-bit code (110) is used together with the displacement vector representing the best match of the block along with the motion compensated DPCM data (transform coefficient differences between the present block and the best matched block from the reconstructed previous frame). The mode ID and vector appear on line 65 in FIG. 2. At the receiver, these DPCM data are inverse transformed and added onto the compensated block pixels from the reconstructed previous frame to form the present block pixels.

Intraframe Mode

The intraframe mode is selected when neither the motion-compensated mode nor the DPCM mode is justified. The difference, $d_0$, between the current block pixels and the reconstructed previous block pixels is compared with the predetermined DPCM threshold, $T_{D/I}$. The decision process is as follows:

If $(d_0-d_b) < T_M$ and $d_0 > T_{D/I}$, select intraframe mode.

If the intraframe mode is selected, the predictor is disabled and the current block pixels are sent to the transformer with unit 11 of FIG. 2. Typically, a four-bit code (1110) appearing on line 66 in FIG. 2 is used to identify the "intraframe mode". The intraframe data in the receiver are inversely transformed to form the present block pixels.

Compensation Range and Resolution

The performance of the motion compensated system is dependent upon the range and resolution of the matching process. The larger the range and the finer the resolution, the better the system performs. However, due to the necessity of encoding the vector information as system overhead, the range and resolution of the searching process is somewhat limited.

Searching Algorithm

The search for the best matched position is a very time consuming process. As one example, a simple binary search algorithm for a maximum range of 1.75 can be employed. Using such an algorithm, the nine whole-pixel positions centered around the position of the present block are first examined to find the best match. Next, the eight half-pixel neighborhood positions centered around the best matched whole-pixel position are examined. The process continues until the best matched quarter-pixel position is located. The horizontal and vertical addresses of this location are then recorded as a vector and encoded accordingly. The number of steps required for a binary search is many times lower than that of a brute force search.

Subpixel translation is done by performing bilinear interpolation taking weighted averages of the four nearest values at integral pixel positions surrounding the subpixel location. The weighting factors that are used are linear functions of the horizontal and vertical distance of the fractional displacement from the integral pixel positions. As an example, a displacement of 1.25 horizontally, and 0.75 vertically is performed as follows:

$$f(j+1.25, k-0.75) = w_1 f(j+1,k) + w_2 f(j+1,k-1) + w_3 f(j+2,k) + w_4 f(j+2,k-1) \quad \text{Eq. (3)}$$

where $w_1 = (0.75)(0.25)$, $w_2 = (0.75)(0.75)$, $w_3 = (0.25)(0.25)$, and $w_4 = (0.25)(0.75)$

DPCM Loop

Referring to FIG. 2, the Differential Pulse Code Modulated (DPCM) loop consists of a cosine transform unit 11, a normalization unit 12, a quantization unit 13, an inverse normalization unit 16, an inverse transform unit 17, a delay memory 18, and a prediction unit 19. In operation, an input pixel block on lines 5 from the present frame is first subtracted in subtractor 10 by its estimation from the previous frame on line 23 on a pixel-by-pixel basis to generate block differences. These differences are then cosine transformed in transform unit 11 to form the coefficient differences on lines 24. The coefficient differences are next scaled in normalizer unit 12 according to a feedback parameter on lines 25 from the output rate buffer 15. The scaled coefficient difference on lines 26 are then quantized in unit 13 and fed into both the coder unit 14 and the inverse DPCM loop 9. In the inverse DPCM loop 9, the quantized and scaled data are inversely normalized in unit 16 and inversely transformed in unit 17, to form the quantized coefficient differences on lines 27. These differences are then added in adder 20 to the motion compensated estimation on lines 3 to form the reconstructed pixel block in the frame memory 18. After a single-frame delay, in memory 18, the motion detector 7 uses the motion compensated block from the memory 18, multiplies it by a prediction weighting factor, and is ready for the next frame of operation. At the receiver, the received data follows the inverse DPCM loop to reconstruct the spatial pixels in the output block.

Cosine Transform

The coefficient differences between the input pixels from the present frame on lines 5 and the estimations from the previously reconstructed frame on lines 3 are formed by the difference circuit 10 on lines 23 and are expressed as follows:

$$e_n(j,k) = f_n(j,k) - p(j,k)\bar{f}_{N-1}(j+\Delta j, k+\Delta k) \quad \text{Eq. (4)}$$

where $\Delta j$ and $\Delta k$ represent the vector values for the best match determined by the motion detector and where $p(j,k)$ represents the estimation. These differences within a $N \times N$ block are cosine transformed in transformer 11 to form the coefficient differences on lines 24. The cosine transform is defined as follows:

$$E_n(u,v) = 4[C(u)C(v)]/N^2 \sum_{j=0}^{N-1} \sum_{k=0}^{N-1} e_n(j,k) \quad \text{Eq. (5)}$$

-continued
$$\cos[(2j+1)u\pi/2N]\cos[(2k+1)v\pi/2N]$$
for $u,v = 0, 1, \ldots, N-1$
$C(w) = 1/(2^{\frac{1}{2}})$ for $w = 0$
$\phantom{C(w)} = 1$ for $w = 1, 2, \ldots, N-1$ where $w = u$ or $v$ where (j,k) and (u,v) represent indices in the horizontal and vertical directions for the pixel difference and coefficient difference blocks, respectively, and where C(w) represents C(u) or C(v). The cosine transform restructures the spatial domain data into the coefficient domain such that it will be beneficial to the subsequent coding and redundancy removal processes.

Normalization

The coefficient differences, $E_n(u,v)$, are scaled according to a feedback normalization factor, D, on lines 25, from the output rate buffer 15 according to the relation, $$I_n(u,v) = E_n(u,v)/D \quad \text{Eq. (6)}$$

The scaling process adjusts the range of the coefficient differences such that a desired number of code bits can be used during the coding process.

Quantization

The quantization process in unit 13 is any conventional linear or non-linear quantization. The quantization process will set some of the differences to zeros and leave a limited number of significant other differences to be coded. The quantized coefficient differences on lines 28 are represented as follows:

$$\bar{I}_n(u,v) = Q[I_n(u,v)] \quad \text{Eq. (7)}$$

where $Q[\ ]$ is a quantization function.

It should be noted that a lower bound is determined for the normalization factor in order to introduce meaningful coefficient differences to the coder. Generally speaking, setting the minimum value of D to one is sufficient for a low rate compression applications involving transform blocks of 16 by 16 pixels. In this case the worst mean square quantization error is less than 0.083. This mean square error corresponds to a peak signal-to-quantization-noise ratio of 40.86 db which is relatively insignificant for low rate applications.

Inverse Normalization

The process of inverse normalization in unit 16 produces the quantized coefficient differences on lines 29 in the inverse DPCM loop 9. This process is represented as follows:

$$\bar{E}_n(u,v) = \bar{I}_n(u,v)D \quad \text{Eq. (8)}$$

Inverse Cosine Transform

The inverse cosine transform process in unit 17 in the inverse DPCM loop 9 converts the quantized coefficient differences on lines 29 back to the spatial domain pixel differences on lines 27. This process is defined as follows:

$$\bar{e}_n(j,k) = \sum_{u=0}^{N-1} \sum_{v=0}^{N-1} C(u)C(v)\bar{E}_n(u,v) \quad \text{Eq. (9)}$$

$\cos[(2j+1)u\pi]/2N \quad \cos[(2k+1)v\pi]/2N$
for $j, k, = 0, 1, \ldots, N-1$.

Frame Memory

The frame memory 18 contains the reconstructed input pixels in the inverse DPCM loop. The quantized pixel differences from the inverse cosine transformer on lines 27 and the motion compensated estimations from the previously reconstructed frame on lines 3 are added together in adder 20 to form the reconstructed pixels, $\bar{f}_n(j,k)$, which replace the block pixels in the memory 18. This process is represented as follows:

$$\bar{f}_n(j,k) = \bar{e}_n(j,k) + \rho(j,k)\bar{f}_{n-1}(j+\Delta j, k+\Delta k) \quad \text{Eq. (10)}$$

Prediction

The prediction process in unit 19 finds an estimation of a datum from its surrounding data. By way of example for a simple predictor that uses the previous frame as a base for the estimation, the estimated value is termed as the correlation coefficient, $\rho(j,k)$, given as follows:

$$\rho(j,k) = E[e_n(j,k)e_{n-1}(j+\Delta j, k+\Delta k)]/\sigma^2(j,k) \quad \text{Eq. (11)}$$

where E represents expected value and $\sigma^2(j,k)$ represents the variance of $e_n(j,k)$. The correlation coefficient, termed as leak factor, ranges from 0 to 1 depending on the frame-to-frame pixel differences. The value is very close to 1 for a limited motion sequence. However, during a scene cut or a rapid zooming sequence, the value is way below the value of 1. Because different leak factors have to be identified in the encoding of the DPCM process, it represents a significant overhead for the low rate system if too many values are to be identified. In one embodiment, only two leak factor values are used for the five-mode motion detection system: 1 for the non-motion-compensated DPCM and motion compensated DPCM modes and 0 for the intraframe mode.

Coding

In order to minimize overhead code bits, in one typical example the encoding process in unit 14 for the FIG. 2 system is performed on a frame by frame bases. The coded bit stream includes sync, header, scaling factor (NF), and variable-length data as follows:

TABLE 1

| | | | variable |
|---|---|---|---|
| SYNC | HEADER | NF | DATA |

In the header, at least one bit is reserved for the identification of full motion and graphic operations. The data portion includes the block-to-block mode identifiers, the vector values, DPCM and intraframe data. The bit allocations are dependent upon each individual block which is illustrated in TABLE 2.

TABLE 2

| 1 |
|---|
| MODE |

Replenishment Block

| 4 | 8 |
|---|---|
| MODE | VECTOR |

Replenishment of Motion Compensated Block

| 2 | variable | |
|---|---|---|
| MODE | DPCM | EOB |

DPCM of Non-motion Compensated Block

| 4 | variable | |
|---|---|---|
| MODE | INTRAFRAME | EOB |

Intraframe of Non-motion Compensated Block

TABLE 2-continued

| 3 | 8 | variable | |
|---|---|---|---|
| MODE | VECTOR | DPCM | EOB |

DPCM of Motion Compensated Block

DPCM Encoding

The Scene Adaptive Coding (SAC) is very efficient in terms of coding the intraframe transform coefficients. When this scheme is applied to a coding system involving intraframe, interframe and motion compensation, the coding efficiency is somewhat reduced due to the structure of coefficient differences or motion compensated coefficient differences caused by the additional removal of redundancies. One observation that can be made in the motion compensated coefficient differences (non-zero after normalization and quantization) and, to a certain degree, the interframe coefficient differences (non-zero differences) is that most of these differences are sparsely distributed with an overwhelming majority of them having an absolute value of one. Also, within these differences of ones, a significant portion of them are isolated (surrounded by zero-valued coefficients) along the path of a scanning. It is wasteful to use one amplitude code word to code each of these isolated ones in addition to using one runlength code word to identify their address (Runlength alone should be enough).

Ordered Redundancy Coding

A new Ordered Redundancy (OR) coding algorithm is specifically designed to code multi-valued digital numbers where the statistical frequency of occurrence of some values in the series of values forming the digital number is greater than the statistical frequency of occurrence for other values in the series of values forming the digital number. The values forming the digital numbers are generally the integers 0, 1, 2, 3, . . . and so on.

In general, a K-valued digital number, $X(k)$, is formed by a series of K values, $x(k)$, as follows:

$$X(k) = x(1), x(2), x(3), \ldots x(k), \ldots, x(K)$$

where $1 \leq k \leq K$. Each value, $x(k)$, has some value, $V_j$, from the set of J values, $$V_1, V_2, V_3, \ldots, V_j, \ldots, V_J$$

where $1 \leq j \leq J$.

The occurrence of i consecutive values, $V_j$, within the series $X(k)$ is the runlength of such values denoted by $V_j^i$.

In a first example with $k=1, \ldots, 14$, if the digital number $X_1(k)=01000000100021$, $V_0=0$, $V_1=1$ and $V_2=2$ then $X_1(k)=V_0^1, V_1^1, V_0^6, V_1^1, V_0^3, V_2^1, V_1^1$. In the series values forming $X_1(k)$, the first value $V_0=0$ occurs most frequently, the second value $V_1=1$ occurs next most frequently, and the other value $V_2=2$ occurs least frequently.

In a second example with $k=1, \ldots, 14$, if the digital number $X_2(k)=02111110001130$, and $V_0=1$, $V_1=0$, $V_2=2$, and $V_3=3$; then $X_2(k)=V_1^1, V_2^1, V_0^5, V_1^3, V_0^2, V_3^1, V_1^1$. In the series of values forming $X_2(k)$, the first value, $V_0=1$, occurs most frequently, the seond value $V_1=0$ occurs next most frequently, and the other values, $V_2=2$ and $V_3=3$, occur next most frequently.

Digital numbers formed with such frequencies of occurrence of values such as for $X_1(k)$ and $X_2(k)$ above, are defined as having ordered redundancy. In the typical example described for $X_1(k)$, 0's are most redundant, 1's are next most redundant, and so on. The frequency of occurrence order of values 0, 1, 2, ... and so on described is merely one typical example. Any frequency of occurrence order is possible, for example, the 2's may occur more frequently than 1's and 0's may occur more frequently than 2's.

Digital numbers, $X(k)$, will often have ordered redundancy of the values, $V_j$, forming the number. Ordered redundancy means that the frequency of occurrence of some of the values, $V_j$, formng the number (or groups of such values) is greater than that for other values (or other groups of such values) forming the number and that such frequencies of occurrence are predictable for a number of digital numbers, $X(k)$.

When such ordered redundancy occurs, the ordered redundancy coding of the present invention is useful in making the coding more efficient. In the present invention, the presence of a first value (or a first set of values) is used to imply the existence of a second value (or a second set of values) thereby eliminating the need to code the second value (or second set of values).

By way of example, the coding of the digital number $X_1(k)$ above is achieved as follows. Assume that when the first value, $V_0$, is followed by the second value, $V_1$, that the second value is implied and such code is denoted $C_{01}{}^i$ where i represents the number of consecutive first values $V_0$ preceding the implied second value, $V_1$. Assume that when the first value $V_0$, is not followed by the second value, $V_1$, such code is denoted $C_{0\bar{1}}{}^i$. Assume that any other value is amplitude coded with $A_2=2$ and $A_3=3$. With such a notation, $X_1(k) = C_{01}{}^1, C_{01}{}^6, C_{0\bar{1}}{}^3, A_3, C_{01}{}^0$.

By way of the second example, $X_2(k)$ above, the first value, $V_0-1$ implies the second value, $V_1=0$ such that $X_2(k) = C_{01}{}^0, C_{0\bar{1}}{}^3, A_2, C_{01}{}^5, C_{01}{}^0, C_{01}{}^0, C_{01}{}^0, C_{0\bar{1}}{}^2, A_3, C_{10}{}^0$.

In order to code $X_1(k) = C_{01}{}^1, C_{01}{}^6, C_{0\bar{1}}{}^3, A_3, C_{01}{}^0$, each of the values $C_{01}{}^1, C_{01}{}^6$ and so forth are represented by a unique statistical code (typically a binary code) from a runlength table such that the statistically more frequently occurring values have shorter code lengths and the statistically less frequently occurring values have longer code lengths.

A series of values in digital numbers having a large percentage of zeros (0's) followed by ones (1's) is termed "One's Redundancy". One's Redundancy Coding is one example of Ordered Redundancy (OR) coding. The OR coding procedures for One's Redundancy appear in TABLE 3 and are based upon 16×16 transform blocks of values where each such block gives rise to a digital number, $X(k)$, having 256 values. Of course, any size blocks (N×M) of digital values can be selected. Also, the digital values can be in block form representing transform coefficients or can be multi-valued digital signals, $X(k)$, of any form.

In order to identify the beginning or end of the values forming a number, $X(k)$, a special "End of Block" signal, EOB, is utilized. When a plurality of numbers $X_1(k), X_2(k), X_3(k), \ldots$ and so on are to be coded and transmitted, the EOB code is inserted between the numbers, usually once after each number.

The TABLE 3 example is premised upon digital signals having first values $V_1=0$, second values $V_2=1$, and a set of other values, $V_{\bar{2}}$, greater than 1 (2, 3, 4, ...). Also, TABLE 3 has a runlength table partitioned into first and second parts, a first part, R (or $C_{01}$), and a second part, R' (or $C_{0\bar{1}}$). The first part, R, implies that a runlength of 0's is followed by a 1. The second part, R', implies that a runlength of 0's is followed by another value greater than 1 (2, 3, 4, ...). The TABLE 3 formulation is for one preferred embodiment of the ordered redundancy coding. Many variations, some hereinafter described, are possible.

TABLE 3

1. From the magnitude (without sign) of quantized coefficient difference, form the following sets of histograms
   a. Runlength of consecutive zero-value coefficient differences (including runlength of zero length) with absolute amplitude value of one at the end of the runlength.
   b. Runlength of consecutive zero-valued coefficient differences (including runlength of zero length) with absolute amplitude value of greater than one at the end of the runlength.
   c. Occurrence of end of blocks (EOB, all 0's)
2. Get runlength Huffman code table from the histogram of 1 above. The entries of this table can be represented as $R_0, R_1, R_2, \ldots, R_{255}, R'_0, R'_1, R'_2, \ldots, R'_{255}$, EOB.
3. From case b of 1, get the histogram of the amplitudes (with values greater than one) at the end of the runlength.
4. Get amplitude Huffman code table from the histogram of 3 above. The entries of this table can be represented as $A_2, A_3, A_4, \ldots, A_{510}$.
5. Encode the coefficient differences along the zig-zag path from the Huffman tables generated from 2 and 4 in the following fashion.
   a. Coefficient differences of one at the end of the consecutive zeros—encode with R+SIGN, n=1, 2, 3, ..., 255.
   b. Coefficient differences of greater than one at the end of consecutive zeros—encode with R'+$A_m$+SIGN, n=1, 2, 3, ..., 255 and m=2, 3, 4, ..., 510.
6. Encode with EOB at the end of each block.

As can be seen from TABLE 3, two Huffman tables or equivalent statistical coding tables are specified in the "One's Redundancy" (OR) coding. The runlength table (including EOB) consists of two parts, R and R', with a total of 513 entries (256 each for the first part R and the second part R' and 1 for EOB). The amplitude table consists of 509 entries (amplitude values of 2 to 510). In a practical implementation, these two tables can be shortened with little performance degradation.

Specific examples of the two tables specified in accordance with TABLE 3 appear as the following TABLES 6 and 7. TABLE 6 is a runlength table of the two part example (R and R' or $R_1$ and $R_2$) where R implies a runlength of 0's followed by a 1. TABLES 6 and 7 are derived based upon the hardware constraints (which are intended to be representative of a practical system, but are not intended to be limiting) of the following TABLE 4:

TABLE 4

1. Every code word must belong to part of a complete "tree".
2. The longest code word (including runlength escape, runlength code and sign, or amplitude escape and amplitude code) must not exceed 16 bits in length.
3. The maximum number of entries for each runlength or amplitude table must not exceed 32.

TABLE 5 gives four comparative examples for coding digital numbers using Scene Adaptive Coding (SAC) and One's Redundancy (OR) coding. The One's Rendundancy coding examples utilize TABLES 6 and 7 and the Scene Adaptive Coding examples utilize TABLES 8 and 9. As can be seen from TABLE 5, the OR coding is considerably shorter than the SAC coding and hence OR coding is more efficient.

TABLE 5
COMPARISON OF "OR" AND "SAC" CODING

1. CO    00000000000000000001 EOB
   SAC   $RLP+R_{19}+A_1+S+EOB$
         01/1110111/11/0/100001
   OR    $R_{19}+S+EOB$
         0001000/0/0010

2. CO    001-1000001000-1 EOB
   SAC   $RLP+R_2+A_1+S+A_1+\bar{S}+RLP+R_5+A_1+S+RLP+R_3+A_1+S+EOB$
         01/1111/11/0/11/1/01/11010/11/0/01/1011/11/1/100001
   OR    $R_2+S+R_0+\bar{S}+R_5+S+R_3+\bar{S}+EOB$
         1110/0/10/1/00011/0/0000/1/0010

3. CO    20000000-1 EOB
   SAC   $A_2+S+RLP+R_7+A_1+\bar{S}+EOB$
         101/0/01/110011/11/1/100001
   OR    $R_0'+A_2+S+R_7+\bar{S}+EOB$
         110/1/0/011110/1/0010

4. CO    1001-200001 EOB
   SAC   $A_1+S+R_2+A_1+S+A_2+\bar{S}+R_4+A_1+S+EOB$
         11/0/1111/11/0/101/1/11100/11/0/10001
   OR    $R_0+S+R_2+S+R_0'+A_2+\bar{S}+R_4+S+EOB$
         10/0/1110/0/11011/01101/0/0010 where,
R = runlength, A = amplitude, S = positive sign,
$\bar{S}$ = negative sign, RLP = Run Length Prefix (01),
EOP = End Of Block, CO = digital number to be coded

TABLE 6
RUN LENGTH CODE TABLE FOR THE "ONE'S REDUNDANCY" CODING
RUN LENGTH CODES FOR DPCM MODE

| T | L | FREQ | # of BITS | CODE | OCTAL EQUIV |
|---|---|------|-----------|------|-------------|
| R | 0 | 26644. | 2 | 10 | 2 |
| R' | 0 | 15621. | 3 | 110 | 6 |
| R | 1 | 12324. | 3 | 010 | 2 |
| R | 2 | 7148. | 4 | 1110 | 16 |
| R | 3 | 4610. | 4 | 0000 | 0 |
| R | 4 | 3384. | 5 | 01101 | 15 |
| R' | 1 | 3143. | 5 | 01100 | 14 |
| R | 5 | 2577. | 5 | 00011 | 3 |
| R | 6 | 1967. | 6 | 111100 | 74 |
| R | 7 | 1764. | 6 | 011110 | 36 |
| R | 8 | 1452. | 6 | 001111 | 17 |
| R | 9 | 1327. | 6 | 001101 | 15 |
| R | 10 | 1089. | 6 | 000101 | 5 |
| R' | 2 | 1013. | 7 | 1111011 | 173 |
| R | 11 | 994. | 7 | 1111010 | 172 |
| R | 12 | 884. | 7 | 0111011 | 73 |
| R | 13 | 876. | 7 | 0111010 | 72 |
| R | 14 | 861. | 7 | 0011100 | 71 |
| R | 15 | 687. | 7 | 0011100 | 34 |
| R | 16 | 673. | 7 | 0011001 | 31 |
| R | 17 | 602. | 7 | 0011000 | 30 |
| R | 18 | 550. | 7 | 0001001 | 11 |
| R | 19 | 496. | 7 | 0001000 | 10 |
| R | 20 | 485. | 8 | 01111101 | 175 |
| R | 21 | 455. | 8 | 01111100 | 174 |
| R | 22 | 413. | 8 | 01110001 | 161 |
| R' | 3 | 402. | 8 | 01110000 | 160 |
| R | 23 | 370. | 8 | 00111011 | 73 |
| R | 24 | 345. | 8 | 00111010 | 72 |
| R | ESC | 4599. | 5 | 11111 | 37 |
| R' | ESC | 982. | 7 | 0111111 | 77 |

TABLE 6-continued
RUN LENGTH CODE TABLE FOR THE "ONE'S REDUNDANCY" CODING
RUN LENGTH CODES FOR DPCM MODE

| T | L | FREQ | # of BITS | CODE | OCTAL EQUIV |
|---|---|------|-----------|------|-------------|
| EOB | | 5047. | 4 | 0010 | 2 | where,
R ESC = code used whenever R-type value not in table
R' ESC = code used when R'-type value not in table.

TABLE 7
AMPLITUDE CODE TABLE FOR THE "ONE'S REDUNDANCY" CODING
AMPLITUDE CODES FOR DPCM MODE

| | A | FREQ | # of BITS | CODE | OCTAL EQUIV |
|---|---|------|-----------|------|-------------|
| A | 2 | 11076. | 1 | 1 | 1 |
| A | 3 | 3846. | 2 | 00 | 0 |
| A | 4 | 1751. | 4 | 0110 | 6 |
| A | 5 | 982. | 5 | 01111 | 17 |
| A | 6 | 663. | 5 | 01010 | 12 |
| A | 7 | 435. | 6 | 01100 | 34 |
| A | 8 | 347. | 6 | 010011 | 23 |
| A | 9 | 277. | 6 | 010001 | 21 |
| A | 10 | 173. | 7 | 0101100 | 54 |
| A | 11 | 178. | 7 | 0101101 | 55 |
| A | 12 | 137. | 7 | 0100100 | 44 |
| A | 13 | 113. | 8 | 01110101 | 165 |
| A | 14 | 116. | 8 | 01110110 | 166 |
| A | 15 | 79. | 8 | 01001010 | 112 |
| A | 16 | 68. | 8 | 01000011 | 103 |
| A | 17 | 67. | 8 | 01000010 | 102 |
| A | 18 | 58. | 9 | 011101110 | 356 |
| A | 19 | 49. | 9 | 011101000 | 350 |
| A | 20 | 50. | 9 | 011101001 | 351 |
| A | 21 | 30. | 10 | 0111011111 | 737 |
| A | 22 | 32. | 9 | 010000010 | 202 |
| A | 23 | 33. | 9 | 010000011 | 203 |
| A | 24 | 20. | 10 | 0100101100 | 454 |
| A | 25 | 31. | 9 | 010000001 | 201 |
| A | 26 | 22. | 10 | 0100101101 | 455 |
| A | 27 | 30. | 9 | 010000000 | 200 |
| A | 28 | 23. | 10 | 0100101110 | 456 |
| A | 29 | 14. | 11 | 01001011111 | 1137 |
| A | 30 | 14. | 11 | 01110111100 | 1674 |
| A | 31 | 10. | 11 | 01001011110 | 1136 |
| A | 32 | 14. | 11 | 01110111101 | 1675 |
| A | ESC | 423. | 6 | 010111 | 27 | where,
ESC = code used when amplitude value not in table.

TABLE 8
RUN-LENGTH CODES FOR "SCENE ADAPTIVE CODING"

| VALUE | LENGTH | HUFFMAN CODE |
|-------|--------|--------------|
| 1 | 1 | 0 |
| 2 | 4 | 1111 |
| 3 | 4 | 1011 |
| 4 | 5 | 11100 |
| 5 | 5 | 11010 |
| 6 | 5 | 10000 |
| 7 | 6 | 110011 |
| 8 | 6 | 110010 |
| 9 | 6 | 110001 |
| 10 | 6 | 110000 |
| 11 | 6 | 101011 |
| 12 | 6 | 101001 |
| 13 | 6 | 101000 |
| 14 | 6 | 100111 |
| 15 | 6 | 100110 |
| 16 | 6 | 100101 |
| 17 | 6 | 100100 |
| 18 | 6 | 100010 |

TABLE 8-continued

RUN-LENGTH CODES FOR "SCENE ADAPTIVE CODING"

| VALUE | LENGTH | HUFFMAN CODE |
|---|---|---|
| 19 | 7 | 1110111 |
| 20 | 7 | 1110110 |
| 21 | 7 | 1101111 |
| 22 | 7 | 1101110 |
| 23 | 7 | 1101101 |
| 24 | 7 | 1101100 |
| 25 | 7 | 1010101 |
| 26 | 7 | 1000111 |
| 27 | 7 | 1000110 |
| 28 | 8 | 10101000 |
| 29 | 9 | 101010011 |
| 30 | 9 | 101010010 |
| RL-ESC | 6 | 111010 |

TABLE 9

AMPLITUDE CODES FOR SCENE ADAPTIVE CODING

| VALUE | LENGTH | HUFFMAN CODE |
|---|---|---|
| 1 | 2 | 11 |
| 2 | 3 | 101 |
| 3 | 3 | 000 |
| 4 | 4 | 0011 |
| 5 | 5 | 10001 |
| 6 | 5 | 00100 |
| 7 | 6 | 100101 |
| 8 | 6 | 100000 |
| 9 | 7 | 1001110 |
| 10 | 7 | 1001100 |
| 11 | 7 | 0010111 |
| 12 | 8 | 10011111 |
| 13 | 8 | 10011011 |
| 14 | 8 | 10010011 |
| 15 | 8 | 10010001 |
| 16 | 8 | 00101101 |
| 17 | 9 | 100111101 |
| 18 | 9 | 100110101 |
| 19 | 9 | 100110100 |
| 20 | 9 | 100100100 |
| 21 | 9 | 100100000 |
| 22 | 9 | 001011001 |
| 23 | 9 | 001011000 |
| 24 | 10 | 1001111001 |
| 25 | 10 | 1001111000 |
| 26 | 10 | 1001001011 |
| 27 | 10 | 1001001010 |
| 28 | 10 | 1001000011 |
| 29 | 10 | 1001000010 |
| AMP-ESC | 6 | 001010 |
| EOB | 6 | 100001 |
| RL-PREFIX | 2 | 01 |

Ordered Redundancy Variations

Additional variations are possible, for example, three or more parts or their equivalent may be used in the runlength table. A typical example with three parts (R, R' and R'') is as follows. Runlengths of consecutive first values ($V_1=0$) are runlength encoded with three different parts ($R_1$, $R_2$, or $R_3$) depending upon the value following the runlength of 0's. If the following value is a second value (such as $V_2=1$), then $R_1$ is selected for encoding the runlength of the first value (0's in this case). If the following value is a third value (such as $V_3=2$), then $R_2$ is selected for encoding the runlength of the first value (0's in this case). If the following value is another value (greater than 2 such as 3, 4, 5, ...), then $R_3$ is selected for encoding the runlength of the first value (0's in this case). If $R_3$ is selected, then $R_3$ is followed by an amplitude code to specify the exact value (3, 4, 5, ...) following the runlength of first values (0's).

The runlength table utilized with ordered redundancy coding can be of two parts (R and R'), three parts ($R_1$, $R_2$, and $R_3$), or more generally of "n" parts ($R_1$, $R_2$, ..., $R_n$), where n is equal to or greater than 2.

The TABLES 6 and 7 were formed based upon the assumption that a separate sign bit, S or $\bar{S}$, not in the tables is to be used to indicate the sign of each value coded in the manner indicated in TABLE 5. Alternatively, the sign information can be encoded into TABLE 6 or TABLE 7. For example, a table like TABLE 6 can be used to represent runlengths of 0's that are followed both by positive and by negative non-zero numbers. Such a table would be greater in length than TABLE 6 (expanded essentially to double the length) to provide entries for runlengths of 0's followed by both negative and positive non-zero numbers. Of course, such a table would be ordered in accordance with the statistical frequency of both positive and negative numbers.

The two tables, TABLES 6 and 7, were formed based upon the assumption that the values to be coded were categorized into three basic groups or values, namely a first value, $V_1$, a second value, $V_2$, and all other values. In the particular example of coding, the first value $V_1$ is 0, the second value $V_2$ is 1, and the third value is one within the set of all values greater than 1. It often occurs that in a block of values to be coded, the value 0 (the first value) occurs statistically most frequently, the value 1 (the second value) occurs statistically second most frequently, and the other values (the third values) the least frequently.

With such a distribution having ordered redundancy, the coding of the second value (1's in this case) is avoided because the first value (0's in this case) is runlength coded in two parts, one part that implies that the number following the runlength of 0's is the second value (1 in this case) and the other part that indicates that the number following the runlength of 0's is within the set of third values (values greater than 1 in this case).

Alternative formulations are possible. For example, rather than categorizing the values to be coded into three groups as done in connection with TABLE 6, four or more groups are possible. For four groups, the first value (for example $V_1=0$) is coded in three parts, namely, a first part for implying a second value (for example $V_2=1$), a second part for implying a third value (for example $V_3=2$) and a third part for indicating a set of fourth values (values greater than 2).

In general, a multivalued digital number, X(k), to be coded with n-1 implied values has a first value, $V_1$, a second value, $V_2$, ..., a j-value, $V_j$, a (J+1)-value, $V_{j+1}$, ..., a n-value, $V_n$, for j ranging from 1 to n, and has other values. The digital signals are coded with n-1 implied values to form statistically coded signals such that the more frequently occurring values of the digital signals are represented by shorter code lengths and the less frequently occurring values of coded signals are represented by longer code lengths. The coding includes, for each value, $V_j$, for j from 1 to n, forming $j^{th}$ runlength code values representing the number of consecutive first values followed by the j+1 value, forming additional runlength code values representing the number of consecutive first values followed by any of said other values.

While the embodiments described have used one code (such as R) based upon the existence of a runlength of a first value to imply a second value, the implied code is not limited to a single value but can be itself multivalued. For example, a runlength of 0's followed by two 1's can be implied by a code R''.

While the implied coding of the second value was typically as a result of runlength coding the first value, other types of coding of the first value are included within the present invention.

As another alternative, the statistically most frequent value is not necessarily the value that is runlength encoded. Where three groups of values are employed (such as 0's, 1's and greater than 1's), the second value (1's in this case) can be runlength encoded to imply the first value (0's in this case) or to specify the third values (numbers greater than 1 in this case).

In an example where the number of values $V_j$, are limited, the need for amplitude coding can be eliminated. For example, if only the values $V_1=0$ and $V_2=1$ are present in the number $X(k)$, then no amplitude coding is required since the $V_1=0$ values can be runlength coded and the values of $V_1=1$ can be implied. Similarly, for an example with only the values $V_1=0$, $V_2=1$, and $V_3=2$, the values of $V_1=0$ can be runlength coded while both $V_2=1$, and $V_3=2$, are implied using a two-part runlength table as previously described.

In an example where all of the values have the same sign, the sign coding can be eliminated.

Coder Details—FIG. 3

In FIG. 3, further details of the coder 14 of FIG. 2 are shown. In FIG. 3, each digital value, $V_j$, of a digital number, $X(k)$, to be coded is input to the CO register 76. Typically, the register 76 is a 16-bit register for storing 16-bit values where the digital number, $X(k)$, is formed of K 16-bit values, each value clocked into register 76 in sequence and one at a time. The comparator 77 compares the absolute value of each value in register 76 to determine if that absolute value is less than 1, equal to 1, or greater than 1. Comparator 78 provides a less-than-1 output signal on line 78, an equal-to-1 signal on line 79, and a greater-than-1 signal on line 80 as a function of the value in register 76. The less-than-1 signal on line 78 indicates an equal-to-0 condition. The control 81 receives the three control values on line 78, 79 and 80 from comparator 77 and controls, in a conventional manner, the coder operations.

The "zero" counter 82 counts the runlength of consecutive zeros detected by the comparator 77. Line 86 from control 81 causes counter 82 to be set to a counting mode for counting consecutive 0 values in register 76. Line 86 causes counter 82 to be reset after each runlength of zeros is counted. After being reset and with line 86 setting counter 82 to the counting mode, counter 82 will count zeros until a non-zero value is detected in register 76. If a non-zero value is detected, either a equal-to-1 signal on line 79 or a greater-than-1 signal on line 80 is enabled and detected by control 81. If an equal-to-1 signal is detected, control 81 asserts the line 87 to specify the R type of operation. The enable line 87 together with the runlength count from counter 82 addresses the runlength table 84. Runlength table 84 is typically a random access memory or a read only memory storing coded runlength values like those of TABLE 6. The 0 runlength output on line 95 from counter 82 together with the 1-bit on line 87 address the table 84 to provide a runlength coded value output on lines 93. The output from table 84 is under control of the signal on line 89 from control 81 and loads the code register 85 with the runlength coded value from the CODE column of TABLE 6. The runlength coded value implies that a runlength of zeros is followed by a 1 in the manner previously described.

After a coded value is loaded into register 85, the sign bit from register 76 is enabled to be stored in register 85 by the enable gate 91 under control of the signal 94 from the control 81.

Thereafter, the next value, $V_j$, of the number, $X(k)$, is loaded into register 76. Counter 82 is cleared and a new runlength of zeros is counted until comparator 77 detects a non-zero value by asserting either an equal-to-1 signal on line 79 or a signal on line 80 signifying a greater-than-1 value in register 76. If the runlength of zeros is followed by a value greater than 1, then line 80 is asserted and control 81 causes line 87 to be not asserted, thereby signifying an R'-type of operation. The runlength value from counter 82 on line 95 together with the non-asserted signal on line 87 causes the runlength table 84 to be addressed to obtain a R' value from table 84. Line 89 causes the output from table 84 to be gated to the code register 85.

Because of a greater than 1 value in register 76, control 81 causes the line 88 to be next enabled to provide an output from the amplitude table 83. The amplitude table 83 is a random access memory or read only memroy loaded with amplitude values like those of TABLE 7. The value in register 76 addresses the amplitude table 83 to provide the appropriate amplitude value output on line 93 for storage in the code register 85. Thereafter, the control 81 causes line 94 to be enabled to cause the sign value from register 76 to be stored in the code register 85.

The FIG. 3 coder continues to process code values in register 76 until an entire block of code values (all values for a digital number, $X(k)$) has been processed. Control 81 includes counters and other appropriate means for counting or otherwise determining all values comprising a digital number. When a full series of values for a digital number $X(k)$ has been processed, control 81 enables the output line 93 to provide an end of block, EOB, signal on line 93 for storage in the control register 85. Control 81 provides the $CLK_1$ signal for clocking each new value into register 76, provides the $CLK_2$ signal for incrementing the zero counter 83 and $CLK_3$ signal for clocking values into register 44. In a conventional manner, control 81 is controlled by a master clock signal CLK, from the transmitter of FIG. 2.

In FIG. 3, when the amplitude table 83 is addressed and produces the ESC code, the ESC detector 126 senses that no amplitude value is available in the table and signals control 81. The ESC value from table 83 is gated into the code register 85. Thereafter, control 81 enables gate 127 via line 181 to gate the value from register 76 into the code register 85. Alternatively, an additional table (not shown) can be provided for storing Huffman coded values of amplitudes not in the table 83. Such an additional Huffman table would provide compression of additional amplitude values.

In FIG. 3, when the runlength table 84 provides the R ESC or the R' ESC code value, the ESC detector 126 senses the ESC value and signals the control 81 on line 130. The ESC code value is clocked into register 85, and on the next cycle, control 81 causes alternate processing to occur. In the example described, gage 129 is enabled to enter directly the value from counter 82 into the code register 85 so that runlengths not in the runlength table 84 are directly entered after the ESC code. Alternatively, an additional runlength table with Huffman coded runlength values can be employed to provide additional compressed runlengths not in the table 84.

While FIG. 3 depicts one embodiment for implementing the coder 14 of FIG. 2, many other software and hardware implementations of the coder are, of course, possible.

Decoder Detail—FIG. 4

In FIG. 4, further details of the decoder 54 of FIG. 1 are shown. The serial-by-bit data is input on line 117 to the code register 101. The input data, as it is clocked into the register 101 by the CLK$_4$ signal, is continuously detected by the detector 102. Detector 102 senses the synchronization, header and other control information and signals the control 107 when coded data is to follow. The coded data is clocked into register 101 one bit at a time. A code value clocked into register 101 is presented in left-to-right order when viewing the CODE column of TABLE 6. With each new code value bit, the coded data from register 101 is input to the inverse runlength table 103 and to the inverse amplitude table 104. The runlength table 103 includes the data of TABLE 6 organized in an inverse order. The inverse order means that table 103 of FIG. 4 is addressed by the CODE column code values and provides as an output the type (R or R') from column T and the length from column L. The type information appears on output line 113. Line 113 is one binary value (for example 1) when the addressed value is of type R and is another binary value (for example 0) when the type is R'.

The R/R' information on line 113 is connected to the control 107. The L information from table 103 is input on line 119 to the runlength counter 105. Typically, the L information is a binary count and runlength counter 105 is parallel loaded with the binary count under control of line 114 from control 107.

If an R ESC or an R' ESC value is detected by detector 102, control 107 is signaled that no valid runlength will be derived from table 103. When control 107 senses that the ESC code has appeared in register 101, control 107 causes the content of the register 101 through gate 125 to be gated into the runlength counter 105. Thereafter, runlength counter 105 is decremented in the manner previously described.

Line 116 output from the table 103 is a validity bit indicating that a valid entry has been found in table 103. As each new code value bit is clocked into register 101, table 103 is addressed to determine if a valid entry is found. Not all input codes from register 101 will find a valid entry in table 103. All valid entries in table 103 provide a validity bit output on line 116 for signalling the control 107. When control 107 receives a valid bit from line 116, the length value for the addressed entry is stored into the runlength counter 105. Thereafter, the runlength counter 105 is decremented by the CLK$_5$ signal thereby counting out the runlength of zeros. Control line 118 inhibits any output from the amplitude table 104 whenever counter 105 is being decremented thereby loading zeros into the CO register 109. When the counter 105 has been counted down and the entire runlength of zeros has been loaded into register 109, control 107 has sensed the R or R' signal from line 113 and thereafter provides the following sequencing.

If line 113 indicated an R-type operation, then line 121 loads a 1 into the register 109 since R-type operations imply a 1 after a runlength of zeros. When line 121 writes a 1 into register 109, gate 108 is enabled by line 119 to load the sign bit, which will be the next bit in order clocked into register 101 into the register 109. Thereafter regiser 101 will be cleared and clocked to receive the next code bits.

If line 113 indicates an R'-type operation, then line 121 is not enabled and line 118 is enabled to read out an amplitude from amplitude table 104. Amplitude table 104 contains the information of TABLE 7 in inverse order. The inverse order indicates that table 104 is addressed by the information in the CODE column and provides an output on line 120 from the A column. Typically, the output value from the A column is a binary number representing the amplitude.

If an ESC value is called for, detector 102 signals control 107 to indicate that no valid amplitude will be obtained from table 104. When the A ESC code appears in the code register 101, the control 107 causes the next amplitude value in code register 101 to be gated directly via gate 108 to the CO register 109.

After an amplitude value is loaded into register 109 from table 104 or register 101, control 107 then signals via line 119 the loading of the sign bit from register 101 into register 109. Register 101 is then cleared to receive the next code value on line 117 from the buffer 53 of FIG. 1.

While FIG. 4 depicts one embodiment of a decoder in accordance with the present invention, many other software and hardware embodiments of the FIG. 5 decoder are possible.

Rate Buffer

The rate buffer 15 in FIG. 2 performs channel rate equalization. The buffer has a variable rate data input on lines 44 and a constant rate data output on lines 44. The differentials are monitored from frame to frame, and the status is converted into a scaling factor that is fed to the normalizer on lines 25. The buffer always forces the coder to adjust to the local coding variations, while ensuring global performance at a desired level.

Let B(n) represent the number of bits into the rate buffer for the nth frame and let S(n) represent the buffer status (difference between the read and write pointers of the FIFO) at the end of the nth frame. Then, B(n) and S(n) can be written as follows:

$$B(n) = K + N_1 + 12 N_2 + \quad \text{Eq. (12)}$$

$$2N_3 + \sum_{i \epsilon N_3} \sum H([\bar{I}(u,v)]_i) +$$

$$11N_4 + \sum_{i \epsilon N_4} \sum H([\bar{I}(u,v)]_i) +$$

$$4N_5 + \sum_{i \epsilon N_5} \sum H([\bar{I}(u,v)]_i)$$

$$S(n) = S(n-1) + [B(n) - N^2 R] \quad \text{Eq. (13)}$$

where $N_1$ = number of blocks in replenishment mode
$N_2$ = number of blocks in motion compensated replenishment mode
$N_3$ = number of blocks in DPCM mode
$N_4$ = number of blocks in motion compensated DPCM mode
$N_5$ = number of blocks in intraframe mode
$[\bar{I}(u,v)]_i$ = normalized and quantized coefficient differences in ith block
$H(.)\}$ = "One's Redundancy" coding function R = average coding rate
$N$ = transform block size
$K$ = sync, header, and NF
$i_\epsilon N_3$ = i belongs to $N_3$ DPCM block $i_c N_4 = i$ belongs to $N_4$ DPCM block
$i_c N_5 = i$ belongs to $N_5$ DPCM block The buffer status $S(n)$ is used to select an instantaneous scaling factor $D^*(n)$ according to an empirically determined "scaling factor versus status" curve. This relationship is described by $$D^*(n) = \Phi\{S(n)\} \qquad \text{Eq. (14)}$$

In order to smooth out this instantaneous scaling factor such that the desired scaling factor does not fluctuate too much, a recursive filtering process is applied as follows:

$$D(n) = (1-c)D(n-1) + cD^*(n) \qquad \text{Eq. (15)}$$

where c is a constant with value less than unity. The rate buffer can be guaranteed not to overflow by introducing a frame repetition mechanism. It can also be prevented from underflow by introducing fill bits.

Frame Repetition

The requirement of a frame repetition in the Motion Compensated Combined Interframe and Intraframe Coding System of FIG. 2 is well justified. Due to the usage of only one normalization factor per frame, an excessive amount of data can flow into the buffer during a scene cut or fast zooming operations. Only instantaneous shutting off of the input data like the frame repetition will prevent the rate buffer from overflowing. Also, in order to prevent the scaling factor from getting too large to introduce blocking artifacts, a frame repetition is desired.

To establish frame repetition in the rate buffer, a threshold in the rate buffer is first established. During the encoding process, if the data within the buffer exceeds this threshold at the end of the frame, frame repetition is initiated to stop the input data. The repetition process is stopped when the data within the buffer is reduced to a level lower than the threshold.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for processing digital signals, where the digital signals have first values, second values and other values, to reduce the amount of data utilized to represent the digital signals and to form statistically coded signals such that the more frequently occurring values of digital signals are represented by shorter code lengths and the less frequently occurring values of digital signals are represented by longer code lengths, comprising, forming first runlength code values representing the number of consecutive first values of said digital signals followed by said second value, forming second runlength code values representing the number of consecutive first values of said digital signals followed by one of said other values.

2. The method of claim 1 further including the step of amplitude encoding said other values.

3. The method of claim 1 further including the step of encoding said first and second runlength code values with a sign value.

4. The method of claim 1 wherein said first values have amplitude zero, said second values have absolute amplitude one, and said other values have absolute amplitudes greater than one whereby said first and second runlength codes values are formed representing the number of consecutive zeros.

5. The method of claim 1 wherein said first values have the highest frequency of occurrence in said digital signals, wherein said second values have the next highest frequency of occurrence in said digital signals, and wherein said other values have the lowest frequency of occurrence in said digital signals.

6. A method for processing input signals to reduce the amount of data utilized to represent the input signals, the steps comprising, processing the input signals to form processed signals where the processed signals are digital numbers having first values, second values, and other values, coding each digital number to form statistically coded signals such that the more frequently occurring values in the digital numbers are represented by shorter code lengths and the less frequently occurring values of coded signals are represented by longer code lengths, said coding including, forming first runlength code values representing the number of consecutive first values followed by said second value in a digital number, forming second runlength code values representing the number of consecutive first values followed by one of said other values in the digital number.

7. The method of claim 6 wherein said coding step includes the step of amplitude encoding said other values.

8. The method of claim 6 wherein said coding step includes the step of encoding said first and second runlength code values with a sign value.

9. The method of claim 6 wherein said processing step forms said first values with amplitude zero, forms said second values with absolute amplitude one, and forms said other values with absolute amplitudes greater than one.

10. The method of claim 6 wherein a table is provided storing a plurality of runlength code values representing a plurality of different numbers of consecutive first values followed by said second value, and storing a plurality of second runlength code values representing a plurality of different numbers of consecutive first values followed by one of said other values, said first runlength code values and said second runlength code values statistically organized in said table such that the statistically more frequently occurring runlength code values are represented by shorter code lengths and the less frequently occurring values are represented by longer code lengths, and wherein said step of forming first runlength code values is performed by table lookup from said table, said step of forming second runlength code values is performed by table lookup from said table.

11. The method of claim 6 wherein said coding step further includes the step of providing an end code to designate the end of a digital number.

12. A method for processing digital signals, where the digital signals have first values, second values and other values, where the processing reduces the amount of data utilized to represent the digital signals and where the processing forms statistically coded signals such that the more frequently occurring values of digital signals are represented by shorter code lengths and the less frequently occurring values of digital signals are represented by longer code lengths, comprising,
   forming a first code value representing a set of said first values followed by said second value,
   forming a second code value representing a set of said first values followed by one or more of said other values.

13. A method for processing digital signals to reduce the amount of data utilized to represent the digital signals, the steps comprising,
   processing the digital signals to form processed signals where the processed signals are multivalued digital numbers and have first values, second values, ..., j-values, (j+1)-values, ..., n-values for j ranging from 1 to n, and have other values,
   coding said processed signals to form statistically coded signals such that the more frequently occurring values of the processed signals are represented by shorter code lengths and the less frequently occurring values of coded signals are represented by longer code lengths, said coding including,
      forming $j^{th}$ runlength code values representing the number of consecutive processed signals of said first value followed by said j+1 value, for each value of j from 1 to n,
      forming additional runlength code values representing the number of consecutive processed signals of said first value followed by any of said other values.

14. The method of claim 13 wherein said coding step includes the step of amplitude encoding said other values.

15. The method of claim 13 wherein said coding step includes the step of encoding said j runlength code values with a sign value.

16. The method of claim 13 wherein said processing step with n=2 forms said first values with j=1 equal to amplitude zero, forms said second values with j=2 equal to absolute amplitude one, and forms said other values with absolute amplitudes greater than one.

17. The method of claim 13 wherein said processing step forms said first values with j=1 equal to amplitude zero, forms said second values with j=2 equal to absolute amplitude one, and forms third values with j=3 equal to absolute amplitude two, and forms other values for n=3 with absolute amplitude greater than 2.

18. The method of claim 6 wherein said processing step includes multiple modes of processing said digital signals to form said processed signals, and includes the step of selecting one of said modes based upon differences in said input signals.

19. The method of claim 6 wherein said input signals represent images and are presented in sequential frames, said processing step including multiple processing modes for processing said input signals to form said processed signals, and including the step of forming the mean-square difference, $d_0$, between input signals from the current frame and representations of input signals from the previous frame and includes the step of forming the mean-square error, $d_b$, between input signals from the present frame and the best matched representation of input signals from the previous frame, said processing step including the step of comparing the difference, $d_0 - d_b$, with a motion threshold $T_M$, and selecting one of said modes based on said comparison.

20. The method of claim 19 including the step of determining when $d_0 - d_b$ is less than $T_M$ and further including the step of selecting a non-motion-compensated replenishment mode when $d_0$ is less than a predetermined threshold $T_R$ and $d_0 - d_b$ is less than $T_M$.

21. The method of claim 19 including the step of determining when $d_0 - d_b$ is less than $T_M$ and further including the step of selecting a non-motion-compensated DPCM mode when $d_b$ is less than a predetermined threshold $T_{D/I}$ and $d_0 - d_b$ is less than $T_M$.

22. The method of claim 19 including the step of selecting an intraframe mode when $d_0$ is greater than a predetermined threshold $T_{D/I}$.

23. The method of claim 19 including the step of determining when $d_0 - d_b$ is greater than $T_M$ and further including the step of selecting a motion compensated replenishment mode when $d_b$ is less than predetermined threshold $T_{D/R}$ and $d_0 - d_b$ is greater than $T_M$.

24. The method of claim 19 including the step of determining when $d_0 - d_b$ is greater than $T_M$ and further including the step of selecting a motion compensated DPCM mode whenever $d_b$ is greater than a predetermined threshold $T_{D/R}$ and $d_0 - d_b$ is greater than $T_M$.

25. An apparatus for processing digital signals, where the digital signals have first values, second values and other values, to reduce the amount of data utilized to represent the digital signals and to form statistically coded signals such that the more frequently occurring values of digital signals are represented by shorter code lengths and the less frequently occurring values of digital signals are represented by longer code lengths, comprising,
   means for forming first runlength code values representing the number of consecutive first values of said digital signals followed by said second value,
   means for forming second runlength code values representing the number of consecutive first values of said digital signals followed by one of said other values.

26. The apparatus of claim 25 further including means for amplitude encoding said other values.

27. The apparatus of claim 25 further including means for encoding said first and second runlength code values with a sign value.

28. The apparatus of claim 25 wherein said first values have amplitude zero, said second values have absolute amplitude one, and said other values have absolute amplitudes greater than one whereby said first and second runlength codes values are formed representing the number of consecutive zeros.

29. The apparatus of claim 25 wherein said first values have the highest frequency of occurrence in said digital signals, wherein said second values have the next highest frequency of occurrence in said digital signals, and wherein said other values have the lowest frequency of occurrence in said digital signals.

30. An apparatus for processing input signals to reduce the amount of data utilized to represent the input signals, the apparatus comprising,
   means for processing the input signals to form processed signals where the processed signals are digital numbers having first values, second values, and other values,
   means for coding each digital number to form statistically coded signals such that the more frequently occurring values in the digital numbers are represented by shorter code lengths and the less frequently occurring values in the digital numbers are represented by longer code lengths, said means for coding including, means for forming first runlength code values representing the number of consecutive first values followed by said second value in a digital number, means for forming second runlength code values representing the number of consecutive first values followed by one of said other values in the digital number.

31. The apparatus of claim 30 wherein said means for coding includes means for amplitude encoding said other values.

32. The apparatus of claim 30 wherein said means for coding includes means for encoding said first and second runlength code values with a sign value.

33. The apparatus of claim 30 wherein said means for processing forms said first values with amplitude zero, forms said second values with absolute amplitude one, and forms said other values with absolute amplitudes greater than one.

34. The apparatus of claim 30 including an addressable table storing runlength code values representing different numbers of consecutive first values followed by said second value, and storing a plurality of second runlength code values representing different numbers of said first values followed by one of said other values, said first runlength code values and said second runlength code values organized in said table such that the statistically more frequently occurring runlength code values in digital numbers are represented by shorter code lengths and the less frequently occurring values in digital numbers are represented by longer code lengths, and wherein said means for forming first runlength code values includes means for addressing said addressable table with a runlength number representing the runlength of said first value followed by said second value in order to obtain said first runlength code value from said table, and said means for forming second runlength code values includes means for addressing said addressable table with a runlength number representing the runlength of said first value followed by one of said other values in order to obtain said second runlength code value.

35. The apparatus of claim 30 wherein said means for coding further includes means for providing an end code to designate an end of a digital number.

36. An apparatus for processing digital signals to reduce the amount of data utilized to represent the digital signals, comprising, means for processing the digital signals to form processed signals where the processed signals are multivalued digital numbers and have first values, second values, . . . , j-values, (j+1)-values, . . . , n-values for j ranging from 1 to n, and have other values, means for coding said processed signals to form statistically coded signals such that the more frequently occurring values in the digital numbers are represented by shorter code lengths and the less frequently occurring values in the digital numbers are represented by longer code lengths, said means for coding including, means for forming $j^{th}$ runlength code values representing the number of consecutive processed signals of said first value followed by said j+1 value, for each value of j from 1 to n, means for forming additional runlength code values representing the number of consecutive processed signals of said first value followed by any of said other values.

37. The apparatus of claim 36 wherein said digital signals represent pixels forming images in sequential frames, said means for processing includes multiple mode processing means for processing said digital signals to form said processed signals, and includes means for forming the mean-square difference, $d_0$, between digital signals representing pixels of the current frame and digital signals representing pixels of the previous frame and includes means for forming the mean-square error, $d_b$, between the digital signals representing pixels in the present frame and digital signals representing the best matched pixels of the previous frame, said means for processing further including means for comparing the difference, $d_0-d_b$, with a motion threshold $T_M$, and means for selecting one of said modes based on said comparison.

38. A method for processing digital signals, where the digital signals have first values, second values and other values, where the processing reduces the amount of data utilized to represent the digital signals and where the processing forms statistically coded signals such that the more frequently occurring values of digital signals are represented by shorter code lengths and the less frequently occurring values of digital signals are represented by longer code lengths, where a first code value is formed representing a set of said first values followed by said second value, a second code value is formed representing a set of said first values followed by one or more of said other values comprising, decoding said first code value to form a set of said first values followed by said second value, decoding said second code value to form a set of said first values followed by one or more of said other values.

39. A method for processing digital signals to reduce the amount of data utilized to represent the digital signals, the steps comprising, processing the digital signals to form processed signals where the processed signals are multivalued digital numbers and have first values, second values, . . . , j-values, (j+1)-values, . . . , n-values for j ranging from 1 to n, and have other values, coding said processed signals to form statistically coded signals such that the more frequently occurring values of the processed signals are represented by shorter code lengths and the less frequently occurring values of coded signals are represented by longer code lengths, said coding including, forming $j^{th}$ runlength code values representing the number of consecutive processed signals of said first value followed by said j+1 value, for each value of j from 1 to n, forming additional runlength code values representing the number of consecutive processed signals of said first value followed by any of said other values transmitting said $j^{th}$ runlength code values and said additional runlength code values to a receiver to form received signal including received $j^{th}$ runlength code values and received additional runlength code values, decoding said received signals to form decoded signals, said decoding including, decoding said received $j^{th}$ runlength code values to form a number of consecutive decoded signals of said first value followed by said j+1 value, for each value of j from 1 to n, decoding said received additional runlength code values to form a number of consecutive decoded signals of said first value followed by any of said other values.

40. The method of claim 39 wherein said coding step includes the step of amplitude encoding said other values.

41. The method of claim 39 wherein said coding step includes the step of encoding said j runlength code values with a sign value.

42. An apparatus for processing input signals to reduce the amount of data utilized to represent the input signals, the apparatus comprising, means for processing the input signals to form processed signals where the processed signals are digital numbers having first values, second values, and other values, means for coding each digital number to form statistically coded signals such that the more frequently occurring values in the digital numbers are represented by shorter code lengths and the less frequently occurring values in the digital numbers are represented by longer code lengths, said means for coding including, means for forming first runlength code values representing the number of consecutive first values followed by said second value in a digital number, means for forming second runlength code values representing the number of consecutive first values followed by one of said other values in the digital number, means for transmitting said $j^{th}$ runlength code values and said additional runlength code values to a receiver to form received signal including received $j^{th}$ runlength code values and received additional runlength code values, means for decoding said received signals to form decoded signals, said means for decoding including, means for decoding said received $j^{th}$ runlength code values to form a number of consecutive decoded signals of said first value followed by said j+1 value, for each value of j from 1 to n, means for decoding said received additional runlength code values to form a number of consecutive decoded signals of said first value followed by any of said other values.

43. The apparatus of claim 42 wherein said means for coding includes means for amplitude encoding said other values.

44. The apparatus of claim 42 wherein said means for coding includes means for encoding said first and second runlength code values with a sign value.

45. The apparatus of claim 42 wherein said means for processing forms said first values with amplitude zero, forms said second values with absolute amplitude one, and forms said other values with absolute amplitudes greater than one.

46. The apparatus of claim 42 including an addressable table storing runlength code values representing different numbers of consecutive first values followed by said second value, and storing a plurality of second runlength code values representing different numbers of said first values followed by one of said other values, said first runlength code values and said second runlength code values organized in said table such that the statistically more frequently occurring runlength code values in digital numbers are represented by shorter code lengths and the less frequently occurring values in digital numbers are represented by longer code lengths, and wherein said means for forming first runlength code values includes means for addressing said addressable table with a runlength number representing the runlength of said first value followed by said second value in order to obtain said first runlength code value from said table, and said means for forming second runlength code values includes means for addressing said addressable table with a runlength number representing the runlength of said first value followed by one of said other values in order to obtain said second runlength code value.

* * * * *

US004698672C1

(12) EX PARTE REEXAMINATION CERTIFICATE (6187th)
United States Patent
Chen et al.

(10) Number: US 4,698,672 C1
(45) Certificate Issued: Apr. 15, 2008

(54) CODING SYSTEM FOR REDUCING REDUNDANCY

(75) Inventors: Wen-hsiung Chen, Sunnyvale, CA (US); Daniel J. Klenke, Milpitas, CA (US)

(73) Assignee: Compression Labs, Inc., Austin, TX (US)

Reexamination Request:
No. 90/007,808, Nov. 21, 2005

Reexamination Certificate for:
Patent No.: 4,698,672
Issued: Oct. 6, 1987
Appl. No.: 06/923,630
Filed: Oct. 27, 1986

(51) Int. Cl.
*G06T 9/00* (2006.01)
*H04N 7/30* (2006.01)
*H04N 7/36* (2006.01)
*H04N 7/26* (2006.01)
*H04N 7/32* (2006.01)
*H03M 7/42* (2006.01)
H04N 7/50

(52) U.S. Cl. .............. 375/240.12; 375/246; 375/E7.14; 375/E7.144; 375/E7.211; 375/E7.214; 375/E7.216; 375/E7.225; 375/E7.231; 375/E7.232; 375/E7.234; 375/E7.244; 375/E7.245; 375/E7.263; 358/1.9

(58) Field of Classification Search ........................ None
See application file for complete search history.

(56) References Cited

U.S. PATENT DOCUMENTS

| | | | | |
|---|---|---|---|---|
| 4,092,676 A | 5/1978 | Saran | ......................... | 358/261 |
| 4,136,363 A | 1/1979 | Saran | ......................... | 358/261 |
| 4,394,774 A | 7/1983 | Widergren et al. | ........... | 382/36 |
| 4,420,771 A | 12/1983 | Pirsch | ........................ | 358/261 |
| 4,454,546 A | 6/1984 | Mori | ......................... | 358/260 |
| 4,476,495 A | 10/1984 | Fujisawa et al. | ............ | 358/262 |
| 4,494,151 A | 1/1985 | Liao | ............................. | 358/261 |
| 4,534,055 A | 8/1985 | Iinuma | ........................ | 381/34 |
| 4,541,012 A | 9/1985 | Tescher | | |
| 4,704,628 A | 11/1987 | Chen et al. | .................. | 358/136 |
| 4,710,813 A | 12/1987 | Wallis et al. | ................ | 358/136 |
| 4,749,983 A | 6/1988 | Langdom, Jr. | .............. | 340/347 |
| 4,901,075 A | 2/1990 | Vogel | ........................... | 341/63 |

FOREIGN PATENT DOCUMENTS

| | | |
|---|---|---|
| JP | 53-146526 | 12/1978 |
| JP | 57-031242 | 2/1982 |
| JP | 57-61387 | 4/1982 |
| JP | 57-106273 | 7/1982 |
| JP | 58-168389 | 10/1983 |
| JP | 62-120791 | 6/1987 |
| JP | 62-249064 | 10/1987 |

OTHER PUBLICATIONS

"Examples of Encoding under Tescher and Chen" provided by Patent Owner's Representative Mr. Robert Asher; Jul. 19, 2006.*

One Figure provided depicts the features described in Tescher (US 4,541,012); Jul. 19, 2006.*

Defendant Microsoft Corporation's Response to Plaintiff Compression Labs, Inc.'s Supplemental Markman Brief, Mar. 31, 2006, *in Re Compression Labs, Inc., Patent Litigation*, U.S. District Court for the Northern District of California San Jose Division, M:05–CV–01654–JF.

Order Requesting Supplemental Briefing, May 12, 2006, *In Re Compression Labs, Inc., Patent Litigation*, M:C 05–01654 JF (RS) and *Microsoft Corp. v. Compression Labs, Inc. et al.* C 05–01567 JF (RS), U.S. District Court for the Northern District of California San Jose Division.

Plaintiff Compression Labs, Inc.'s Second Supplemental Markman Brief, *In Re Compression Labs, Inc., Patent Litigation*,U.S. District Court for the Northern District of California San Jose Division, MDL Action No. M:05–CV–01654 JF.

Defendants Supplemental Markman Brief (Digital Signals), *In Re Compression Labs, Inc.*, M:05–CV–01654 JF MDL 1657 and *Microsoft Corp., v. Compression Labs, Inc. and Forgent Networks, Inc*, CV–05–1567–JF, U.S.. District Court for the Northern District of California San Jose Division.

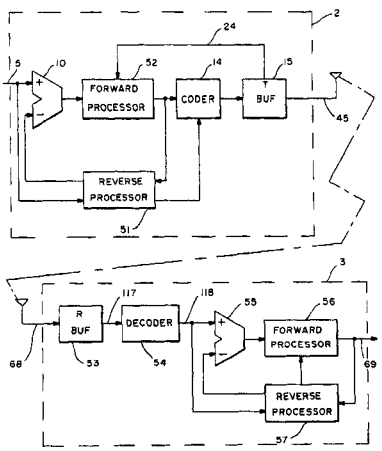

Order[1] Construing Claims of United States Patent No. 4,698,672 *In Re Compression Labs, Inc.,Patent Litigation* ,M: C05–01654 JF (*RS*) and *Microsoft Corp., v. Compression Labs, Inc. and Forgent Networks, Inc*, CV–05–1567–JF, (RS) U.S. . District Court for the Northern Division of California San Jose Division.

Anderson et al., "*Codec squeezes color teleconferencing through digital telephone line*", Electronics, Jan. 1984.

Chen et al., "*Scene Adaptive Coder*", IEEE Transactions on Communications, vol. Com 32, No. 3, Mar. 1984.

Netravali et al., "*Picture Coding: A Review*", IEEE, pp. 366–407, Mar. 1980.

Chen, "*Scene Adaptive Coder*" International Conference on Communications, pp. 22.5.1–22.5.6, Jun. 1981.

Börjesson et al., "*Predictive Coding for ECG Data Compression*", Telecommunication Theory, The Lund Institute of Technology, pp. 1–31, May 1977.

Hudson, "*Photovideotex Image Compression Algorithms— Towards International Standardization*" Proceedings of the 4th Annual ESPRIT Conference, pp. 1137–1148, Sep. 1987.

Bradley, "*Optimizing a Scheme for Run Length Encoding*", Proceedings of the IEEE, pp. 108–109, Jan. 1969.

Huffman, "*A Method for the Construction of Minimum–Redundancy Codes*", Proceedings of the I.R.E., pp. 1098–1101, Sep. 1952.

Lynch, "*New Developments in Convolutional Encoding and Decoding*", NTG/IEEE Conference on Coding, pp. 1–13, Oct. 1970.

Press Release, "*Rapics Stores Lots of Color*", InfoWorld Media Group, p. 58, Sep. 1985.

Press Information "*Color Video Pictures Via Computers*", Widcom, Inc., Sep. 12, 1985.

Press Release, "*Widom–Inc; Introduces New Dimension in Color Video Still Pictures*", Business Wire, Sep. 11, 1985.

"*Zero in on Image Compression Power with the New RAPICS 500™*", Widcom, Inc., 1985.

"*Now you can make and answer your own video phone calls. In color*", Specifications for ACCUNET™ Switched 56, AT&T.

"*The VTC–56 . . . a codec that finally makes it affordable*", Specifications for VTC–56 Teleconference Codec, Widcom, Inc.

Molinder, "*Optimal Coding with a Single Standard Run Length*", IEEE Transactions on Information Theory, vol. IT–20, No. 3, pp. 336–343, May 1974.

Capon, "*A Probabilistic Model for Run–Length Coding of Pictures*", IEEE Transactions on Information Theory, vol. 5, No. 4, pp. 157–163, Dec. 1959.

Huang, "*An Upper Bound on the Entropy of Run–Length Coding*", IEEE Transactions on Information Theory, vol. 20, No. 5, pp. 675–676, Sep. 1974.

Roese et al., "*Interframe Cosine Transform Image Coding*", IEEE Transactions on Communications, vol. Com. 25, No. 11, pp. 1320–1339, Nov. 1977.

Gharavi, "*Conditional Variable–Length Coding for Gray- –Level Picture*", AT&T Bell Laboratories Technical Journal, vol. 2, pp. 249–260, Feb. 1984.

Max, "*Quantizing for Minimum Distortion*", IEEE Transactions on Information Theory, IT–6(1): 7–12 (1960), pp. 66–71.

Netravali et al., "*Ordering Techniques for Coding of Two- –Tone Facsimile Pictures,*" The Bell System Technical Journal, vol. 55, No. 10, pp. 1539–1553, Dec. 1976.

Arps, "*The Statistical Dependence of Run–Lengths in Printed Matter*", IBM and the Inst. for Applied Physics of the ETH Zurich, pp. 218–226.

Meyr et al., "*Optimum Run Length Codes*", IEEE Transactions on Communications, vol. Com. 22, No. 6, pp. 826–835, Jun. 1974.

Endoh et al., "*Progressive Coding Scheme of Multi–Level Images*", Kokusai Denshin Denwa Co. Ltd. (KDD) R&D Laboratories, pp. 1–18.

Pahlm et al., "*Compact Digital Storage of ECGs*", Computer Programs in Biomedicine, vol. 9, No. 3, pp. 293–300, May 1979.

Fukinuki, "*Digital Signal Processing of Image*", pp. 198–201.

Complaint, Jul. 2, 2004, in *Agfa Corp. et al, v. Compression Labs, Inc., Forgent Networks, Inc. and General Instrument, Inc.*, U.S. District Court for the Eastern District of Delaware, C.A. No. 04–818.

Complaint, Sep. 24, 2004, *Audiovox Corp. et al. v. Compression Labs, Inc., Forgent Networks, Inc and General Instrument, Inc.*, U.S. District Court for the Eastern District of Delaware, C.A. No. 04–1293.

Microsoft Corporation's Amended Complaint and Demand for Jury Trial, May 17, 2005, in *Microsoft Corp. v. Compression Labs, Inc., Forgent Networks, Inc and General Instrument, Inc.*, U.S. District Court for Northern District of California San Francisco Division, C05 01567 WHA.

Plaintiff CLI's Responses to Defendants' First Set of Joint Interrogatories, Oct. 19, 2004, in *Compression Labs, Inc. v. Agfa Corp. et al, Dell, Inc. et al., Acer America Corp. et al*, U.S. District Court for the Eastern District of Texas Marshall Division, C.A. No. 2:04–CV–158–DF, C.A. No. 2:04–CV–159–DF, C.A. No. 2:04–CV–294–DF.

Defendants' Preliminary Invalidity Contentions, Dec. 20, 2004, in *Compression Labs, Inc. v. Agfa Corp. et al, Dell, Inc. et al., Acer America Corp. et al*, U.S. District Court for the Eastern District of Texas Marshall Division, C.A. No. 2:04–CV–158–DF, C.A. No. 2:04–CV–159–DF, C.A. No. 2:04–CV–294–DF.

Microsoft's Corporation's Preliminary Invalidity Contentions, Oct. 27, 2005, in *Microsoft, Inc. v. Compression Labs, Inc. and Forgent Networks, Inc.*, U.S. District Court for the Northern District of California San Jose Division, CV–05–1567–JF.

Videotaped Deposition of Wen–Hsiung Chen, Dec. 8, 2005, *in Re Compression Labs, Inc., Patent Litigation*, U.S. District Court for Northern District of California San Francisco Division, M:05–CV–01654 JF and C05 01567.

Videotaped Deposition of Daniel Klenke, Dec. 16, 2005, *in Re Compression Labs, Inc., Patent Litigation*, U.S. District Court for Northern District of California San Francisco Division, M:05–CV–01654 JF and C05 01567.

Plaintiff Compression Labs, Inc.'s Opening Markman Brief, Dec. 23, 2005 *in Re Compression Labs, Inc., Patent Litigation*, U.S. District Court for the Northern District of California San Jose Division, M:05–CV–01654 JF.

Expert Report of Dr. Sheila S. Hemami, Dec. 23, 2005, *in Re Compression Labs, Inc., Patent Litigation*, U.S. District Court for the Northern District of California San Jose Division, M:05–CV–01654 JF.

Videotaped Deposition of James Howard Stephens, Jr., vol. 1, Jan. 11, 2006, *in Re Compression Labs, Inc., Patent Litigation*, U.S. District Court for Northern District of California San Jose Division, M:05–CV–01654 JF and C05 01567.

Videotaped Deposition of James Howard Stephens, Jr., vol. 2, Jan. 12, 2006, *in Re Compression Labs, Inc., Patent Litigation*, U.S. District Court for Northern District of California San Jose Division, M:05–CV–01654 JF.

Videotaped Deposition of David E. LoveJoy, Jan. 19, 2006, *in Re Compression Labs, Inc., Patent Litigation*, U.S. District Court for Northern District of California San Jose Division, M:05–CV–01654 JF and C05 01567.

Defendants and Declaratory Judgment Plaintiffs' Responsive Markman Brief, Jan. 30, 2006, *in Re Compression Labs, Inc., Patent Litigation*, M:05–CV–01654 JF and *Microsoft Corp. v. Compression Labs, Inc. and Forgent Networks, Inc.*, CV–05–1567–JF, U.S. District Court for the Northern District of California San Jose Division.

Declaration of Dr. James A. Storer in Support of Defendants and Declaratory Judgment Plaintiffs' Responsive Markman Brief, Jan. 30, 2006, *in Re Compression Labs, Inc., Patent Litigation*, M:05–CV–01654 JF and *Microsoft Corp. v. Compression Labs, Inc. and Forgent Networks, Inc.*, CV–05–1567–JF U.S. District Court for the Northern District of California San Jose Division.

Plaintiff Compression Labs, Inc.'s Reply Markman Brief, Feb. 6, 2006, *in Re Compression Labs, Inc., Patent Litigation*, U.S. District Court for the Northern District of California San Jose Division, M:05–CV–01654 JF.

Transcript of Appearances Before the Honorable Jeremy Fogel, Mar. 9, 2006, *in Re Compression Labs, Inc., Patent Litigation*, U.S. District Court for the Northern District of California San Jose Division, M:05–CV–01654 JF.

Supplemental Declaration of Dr. Sheila Hemami in Support of Plaintiff's Markman Briefing, Mar. 20, 2006, *in Re Compression Labs, Inc., Patent Litigation*, U.S. District Court for the Northern Division of California San Jose Division, M:05–CV–1654 JF.

Plaintiff Compression Labs, Inc.'s Supplemental Markman Brief, Mar. 20, 2006, *in Re Compression Labs, Inc., Patent Litigation*, U.S. District Court for the Northern District of California San Jose Division, M:05–CV–01654 JF.

\* cited by examiner

*Primary Examiner*—Joseph R. Pokrzywa

(57) ABSTRACT

The present invention relates to methods and apparatus for processing signals to remove redundant information thereby making the signals more suitable for transfer through a limited-bandwidth medium. The present invention specifically relates to methods and apparatus useful in video compression systems. Typically, the system determines differences between the current input signals and the previous input signals using mean-square difference signals. These mean-square signals are processed and compared with one or more thresholds for determining one of several modes of operation. After processing in some mode, the processed signals are in the form of digital numbers and these digital numbers are coded, using ordered redundancy coding, and transmitted to a receiver.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 2, 4, 5, 7, 9, 10, 14, 16–24, 26, 28, 29, 31, 33, 34, 37, 40, 43, 45 and 46 is confirmed.

Claims 1, 3, 6, 8 11–13, 15, 25, 27, 30, 32, 35, 36, 38, 39, 41, 42 and 44 are cancelled.

* * * * *